(12) United States Patent
Tamai et al.

(10) Patent No.: US 6,191,471 B1
(45) Date of Patent: Feb. 20, 2001

(54) TAPE CARRIER PACKAGE WITH TWO REGIONS HAVING LEDS THAT CONNECT UPON FOLDING

(75) Inventors: Shigeki Tamai, Yoshino-gun; Seijirou Gyouten, Tenri, both of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/377,060

(22) Filed: Aug. 19, 1999

(30) Foreign Application Priority Data

Aug. 27, 1998 (JP) .................................................. 10-242288

(51) Int. Cl.[7] .................................................. H01R 43/055
(52) U.S. Cl. .......................... 257/678; 257/700; 257/668; 257/785
(58) Field of Search .................................... 257/678, 700, 257/668, 785

(56) References Cited

U.S. PATENT DOCUMENTS 4,833,568 * 5/1989 Berhold ................................. 361/395

FOREIGN PATENT DOCUMENTS 63684   1/1994 (JP) .

* cited by examiner

Primary Examiner—Fetsum Abraham

(57) ABSTRACT

A tape carrier package is provided with a first region which includes a plurality of input leads for transmitting an input signal between a liquid crystal driver IC chip and a section external to the tape carrier package, and a second region which includes signal transmitting wires for transmitting an input signal among a plurality of the input leads, on one of the surfaces of a tape substrate. Further, in the tape substrate, a folding slit is formed along a boundary between the first region and the second region. The tape substrate is folded into 180 degrees along the folding slit serving as a fold so as to electrically connect a plurality of the input leads and the signal transmitting wires. This arrangement makes it possible to prevent a voltage drop caused by wire resistance.

15 Claims, 20 Drawing Sheets

US 6,191,471 B1

TAPE CARRIER PACKAGE WITH TWO REGIONS HAVING LEDS THAT CONNECT UPON FOLDING

FIELD OF THE INVENTION

This invention relates to a tape carrier package (TCP) which supports an integrated circuit and transmits a signal between a section external to the tape carrier package and the integrated circuit, particularly concerns a tape carrier package which supports a liquid crystal driver integrated circuit (IC) chip for driving a liquid crystal panel disposed in a liquid crystal display device, and which transmits a signal among the liquid crystal driver IC, the liquid crystal panel, and the section external to the TCP.

BACKGROUND OF THE INVENTION

Conventionally, in many cases, a liquid crystal driver IC chip for driving a liquid crystal panel has been installed in the liquid crystal panel as a tape carrier package, which is one of the packages for a semiconductor device. Such a liquid crystal driver IC is installed, for example, in a liquid crystal panel module shown in FIG. 22.

As shown in FIG. 22, a liquid crystal panel 70 is provided with a plurality of tape carrier packages 72, each having a liquid crystal driver IC chip 71. Each tape carrier package 72 includes outer leads (not shown) connected to output terminals and the liquid crystal driver IC chip 71 respectively. The liquid crystal driver IC chip IC 71 is connected with the liquid crystal panel 70 via the outer leads for the output terminals and is connected with a flexible substrate 73 via the outer leads for the input terminals. A signal is transmitted and power is supplied to each of the liquid crystal driver IC chips 71 via wires disposed on the flexible substrate 73.

In recent years, because of a growing need for more compact and lightweight products in the marketplace, it has been necessary to develop a smaller version of a semiconductor device disposed in a liquid crystal panel. In order to meet such a demand, Japanese Unexamined Patent Publication No. 3684/1994(Tokukaihei 6-3684, published on Jan. 14, 1994) discloses a liquid crystal driver IC tape carrier package. FIG. 23 shows a construction of the liquid crystal driver IC tape carrier package disclosed in the above publication.

The above-mentioned liquid crystal driver IC tape carrier package is provided with a liquid crystal driver IC chip 117 at the center, input/output signal terminals 111 and 112 which are bilaterally symmetrical, and a liquid crystal drive output terminal 115 at the center. This construction supplies electricity and transmits various signals (for example, controlling signals such as a clock, a start signal, and a synchronizing signal) by using wires in the liquid crystal driver IC chip 117. With this arrangement, it is not necessary to provide a flexible substrate for supplying power and transmitting various signals.

Generally, it has been required that such a liquid crystal panel module be still more compact and lightweight at lower cost.

However, in the construction which supplies power and transmits various signals by using the wires of the liquid crystal driver IC chip 117, when a number of tape carrier packages are connected, a voltage drop may occur especially on power supplying wires due to an increase in the number of connected tape carrier packages, resulting in degradation in display quality of the liquid crystal panel.

Here, the power supplying wires, which use the wires of the liquid crystal driver IC chip 117, are, for example, those connected to liquid crystal driving power source.

Voltage from the liquid crystal driving power source causes a voltage drop due to resistance on the wires of the liquid crystal driver IC chip 117, and proper driving conditions are not satisfied, resulting in degradation in display quality of the liquid crystal panel. Further, voltage from a logic driving power source is also supplied by using the wires inside the chip; thus, again, a voltage drop may cause an adverse effect on a logic operation. Generally, a liquid crystal panel is normally driven by connecting a number of liquid crystal driver IC chips to the liquid crystal panel, and the greater is the number of LCD IC chips connected, the more serious is the described problem of voltage drop.

SUMMARY OF THE INVENTION

An objective of the present invention is to provide a tape carrier package which can prevent a voltage drop caused by wire resistance.

In order to achieve the objective, the tape carrier package of the present invention, that supports an integrated circuit and transmits a signal between a section external to the tape carrier package and the integrated circuit, including: a tape substrate having a first region and a second region on one of the surfaces thereof, a plurality of leads which are formed in the first region and transmit a signal between the section external to the tape carrier package and the integrated circuit, and signal transmitting wires which are formed in the second region and transmit a signal among a plurality of the leads, is characterized in that the tape substrate can be folded into 180 degrees along a boundary so as to allow the first region and the second region to oppose each other, and a plurality of the leads are electrically connected to the signal transmitting wires in a state in which the tape substrate is folded.

With this arrangement, when the tape substrate is folded into 180 degrees so as to overlay the leads onto the signal transmitting wires, along a boundary serving as a fold between the first region in which a plurality of the leads are formed and the second region in which the signal transmitting wires are formed, it is possible to electrically connect the leads to the signal transmitting wires by soldering, etc. This arrangement makes it possible to transmit input signals and supply power among a plurality of the leads by using mainly the signal transmitting wires disposed on the tape carrier package (TCP), which have lower wire resistance as compared with the wires of the integrated circuit.

Therefore, it is possible to prevent a voltage drop, that has been caused by wire resistance (especially, a power supplying wire) of the integrated circuit when a number of TCPs are connected in a conventional construction, which uses merely the wires of the integrated circuit for transmitting input signals and supplying electricity. For example, this arrangement makes it possible to prevent a degradation in display quality of a liquid crystal display device. Furthermore, with this arrangement, the signal transmitting wires are disposed in a horizontal space of the tape substrate, so that this arrangement can have virtually the same external dimension as the arrangement without signal transmitting wire.

Additionally, it is possible to overlay the input leads of the tape substrate onto the signal transmitting wires of another tape substrate so as to connect the input leads to the signal transmitting wires. In this case, a shift tends to occur between the input leads and the signal transmitting wires due to an error upon overlaying the tape substrate onto the other. Meanwhile, in the above-mentioned arrangement, the input leads and the signal transmitting wires are disposed on the same tape substrate so as to regulate an error occurring upon overlaying the tape substrate (shift upon folding the tape substrate). Consequently, it is possible to improve accuracy upon overlaying the input leads onto the signal transmitting wires.

For a fuller understanding of the nature and advantages of the invention, reference should be made to the ensuing detailed description taken in conjunction with the accompanying drawings.

DESCRIPTION OF THE EMBODIMENTS

[EMBODIMENT 1]

Referring to FIGS. 1 through 6, the following explanation describes one embodiment of the present invention.

Figure 1:
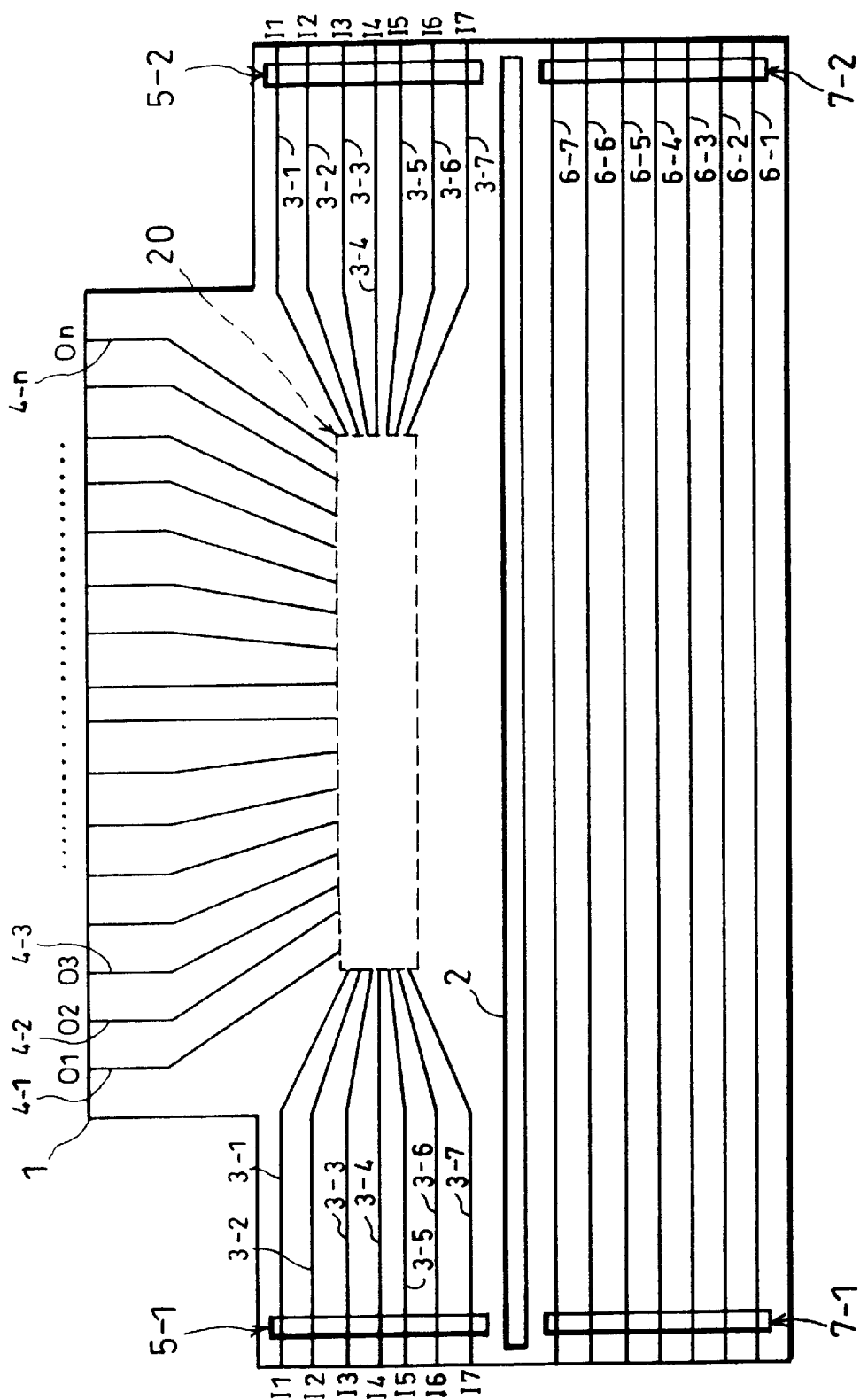
FIG. 1 is a plan view schematically showing a TCP of a first embodiment of the present invention.

As shown in FIG. 1, a tape carrier package (hereinafter, referred to as a TCP) of the present embodiment is provided with a tape substrate 1 which includes a straight-line folding slit 2 disposed along the length. The tape substrate 1 can be folded into 180 degrees along the folding slit 2 serving as a fold. Additionally, FIG. 1 shows a liquid crystal driver IC chip 20 disposed in a hollowed portion (not shown) as an integrated circuit. As for the tape substrate 1, a highly flexible material is favorable in order to fold the TCP into 180 degrees along the folding slit 2 serving as a fold. For example, a polyimide film is preferably used.

One surface of the tape substrate 1 is divided into two regions by the folding slit 2, and one of the regions (first region) is provided with: (a)input leads 3-1 through 3-7 which are extended from the liquid crystal driver IC chip 20 to the right and left ends so as to be bilaterally symmetrical for inputting input signals I1 through I7 from the section external to the TCP to the liquid crystal driver IC chip 20; (b)outputting leads 4-1 through 4-n which are extended from the liquid crystal driver IC chip 20 to the upper end for outputting output signals O1 through On from the liquid crystal driver IC chip 20 to the section external to the TCP; and (c) external connection slits 5-1 and 5-2 that are bilaterally symmetrical so as to connect the input leads 3-1 through 3-7 to input leads of another TCP (not shown). The input leads 3-1 through 3-7 are disposed so as to be bilaterally symmetrical for inputting the input signals I1 through I7 respectively to the left side and the right side, which oppose each other in the liquid crystal driver IC chip 20.

Meanwhile, the other of the two regions, which are divided by the folding slit 2 on one surface of the tape substrate 1 (second region), is provided with: (a) signal transmitting wires 6-1 through 6-7 which are made of a material such as copper so as to transmit input signals I1 through I7 between the left-side input leads 3-1 through 3-7 and the right-side input leads 3-1 through 3-7; and (b) external connection slits 7-1 and 7-2 which are bilaterally symmetrical so as to connect the signal transmitting wires 6-1 through 6-7 to signal transmitting wires of another TCP (not shown).

When the tape substrate 1 is folded into 180 degrees along the folding slit 2 serving as a fold, the signal transmitting wires 6-1 through 6-7 are disposed so as to be overlaid to the input leads 3-1 through 3-7 on the both ends of the tape substrate 1.

The external connection slits 5-1 and 5-2 are respectively disposed in the vicinity of both ends of the IC chip installing region so that the input leads 3-1 through 3-7 are partially exposed. The external connection slits 7-1 and 7-2 are respectively disposed in the vicinity of both ends of the signal transmitting wire region so as to partially expose the signal transmitting wires 6-1 through 6-7. Further, when the tape substrate 1 is folded into 180 degrees along the folding slit 2 serving as a fold, the external connection slits 5-1 and the external connection slit 7-1 are overlaid to each other and the external connection slit 5-2 and the external connection slit 7-2 are overlaid to each other.

The liquid crystal driver IC chip 20 is disposed on the back of the surface of the tape substrate 1 where the input leads 3-1 through 3-7 and the signal transmitting wires 6-1 through 6-7 are formed. The liquid crystal driver IC chip 20 is connected with the input leads 3-1 through 3-7 and the output leads 4-1 through 4-*n* via input pads and output pads (not shown) which are disposed so as to be bilaterally symmetrical on the surface where the input leads 3-1 through 3-7 and the signal transmitting wires 6-1 through 6-7 of the tape substrate 1 are formed.

Figure 2:
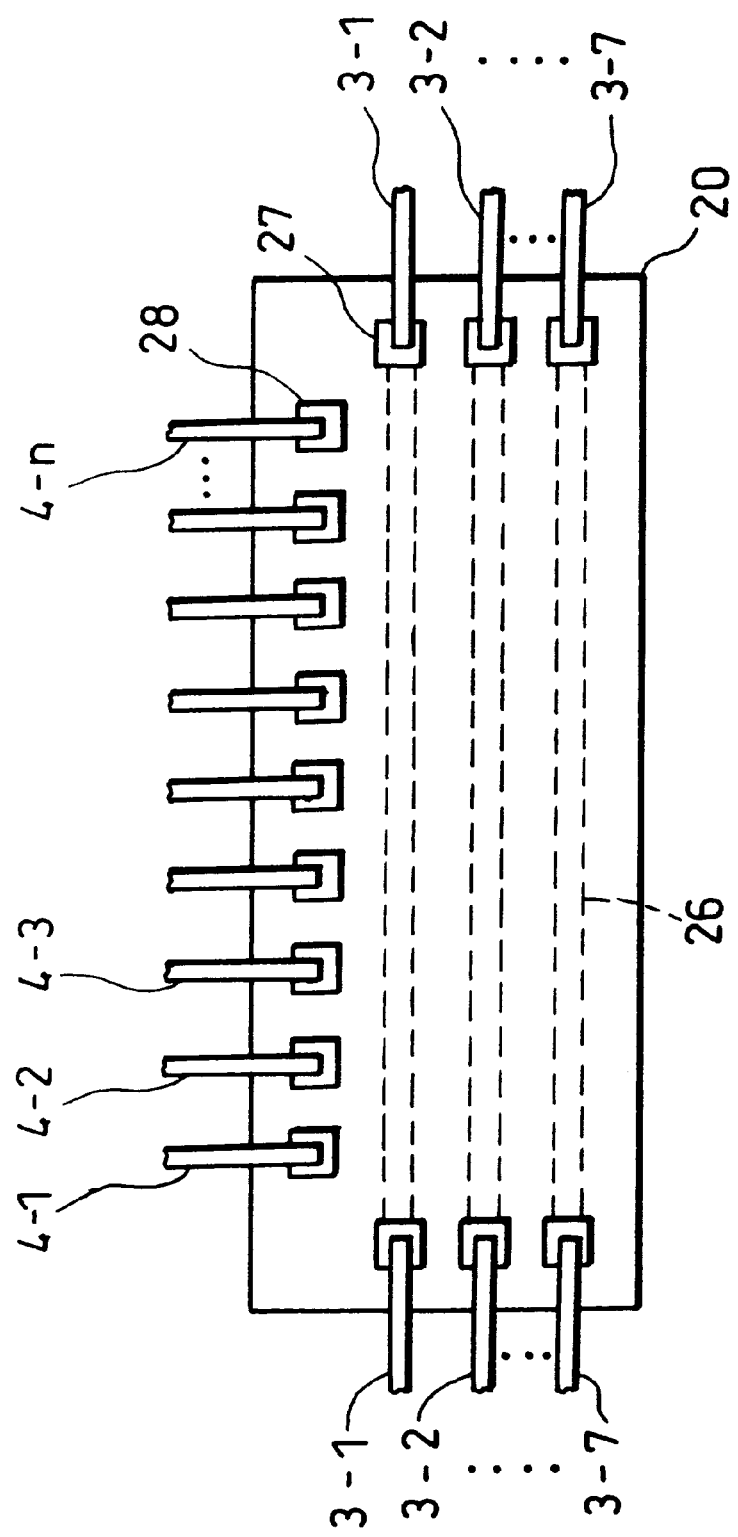
FIG. 2 is a plan view schematically showing a construction of a liquid crystal driver IC chip as an example of an integrated circuit mounted on the TCP of the first embodiment of the present invention.

FIG. 2 shows an example of an arrangement of the liquid crystal driver IC chip 20, the input pads, and the output pads. The upper end of the liquid crystal driver IC chip 20 is provided with output pads 28 which are connected with the output leads 4-1 through 4-*n*. The right and left ends of the liquid crystal driver IC chip 20 are provided with input pads 27 which are connected with the input leads 3-1 through 3-7. The left-side input pads 27 and the right-side input pads 27 are electrically connected with each other via inside wires 26, which are disposed in the liquid crystal driver IC chip 20 and are made of a material such as aluminum. With this arrangement, the input signals I1 through I7 are transmitted between the left-side input leads 3-1 through 3-7 and the right-side input leads 3-1 through 3-7 via the inside wires 26. Here, the inside wires 26 of the liquid crystal driver IC chip 20 are provided when required, so that it is possible to omit the inside wires 26.

As described above, the TCP of the present embodiment supports the liquid crystal driver IC chip 20 and transmits a signal between the section external to the TCP and the liquid crystal driver IC chip 20. One surface of the tape substrate 1 is provided with: (a) a plurality of the input leads 3-1 through 3-7 for transmitting the input signals I1 through I7 between the liquid crystal driver IC chip 20 and a liquid crystal driver IC chip disposed on another TCP; and (b) the signal transmitting wires 6-1 through 6-7 for transmitting the input signals I1 through I7 between the left-side input leads 3-1 through 3-7 and the right-side input leads 3-1 through 3-7. In order to electrically connect the input leads 3-1 through 3-7 and the signal transmitting wires 6-1 through 6-7, the tape substrate 1 can be folded into 180 degrees along the folding slit 2 serving as a fold, which is positioned between the input leads 3-1 through 3-7 and the signal transmitting wires 6-1 through 6-7, so as to overlay the input leads 3-1 through 3-7 onto the signal transmitting wires 6-1 through 6-7.

Next, the following explanation describes how to electrically connect the input leads 3-1 through 3-7 and the signal transmitting wires 6-1 through 6-7.

Firstly, solder resist is applied to a predetermined area (described later) of the surface where the input leads 3-1 through 3-7 and the signal transmitting wires 6-1 through 6-7 are formed. And then, the tape substrate 1 is folded into 180 degrees along the folding slit 2 serving as a fold so that the surface where the input leads 3-1 through 3-7 and the signal transmitting wires 6-1 through 6-7 are formed is inside of the tape substrate 1.

This arrangement makes it possible to overlay the input lead 3-1 onto the signal transmitting wire 6-1, the input lead 3-2 onto the signal transmitting wire 6-2, the input lead 3-3 onto the signal transmitting wire 6-3, the input lead 3-4 onto the signal transmitting wire 6-4, the input lead 3-5 onto the signal transmitting wire 6-5, the input lead 3-6 onto the signal transmitting wire 6-6, and the input lead 3-7 onto the signal transmitting wire 6-7. Further, the external connection slit 5-1 is overlaid to the external connection slit 7-1, and the external connection slit 5-2 is overlaid to the external connection slit 7-2.

Moreover, at a position where the external connection slit 5-1 is overlaid to the external connection slit 7-1, and at a position where the external connection slit 5-2 is overlaid to the external connection slit 7-2, the input leads 3-1 through 3-7 are soldered onto the signal transmitting wires 6-1 through 6-7 so as to be electrically connected with one another.

With this arrangement, the input signals I1 through I7 are transmitted between the left-side input leads 3-1 through 3-7 and the right-side input leads 3-1 through 3-7 via the signal transmitting wires 6-1 through 6-7. Therefore, the left-side input leads 3-1 through 3-7 are connected with the right-side input leads 3-1 through 3-7 in parallel via the inside wires 26 of the liquid crystal driver IC chip 20 and the signal transmitting wires 6-1 through 6-7 disposed on the tape substrate 1. This arrangement makes it possible to transmit the input signals I1 through I7 between the left-side input leads 3-1 through 3-7 and the right-side input leads 3-1 through 3-7 by mainly using the signal transmitting wires 6-1 through 6-7 on the tape substrate 1, that have lower wire resistance as compared with the inside wires 26 of the liquid crystal driver IC chip 20. Thus, as compared with a construction in which the inside wires 26 or the signal transmitting wires 6-1 through 6-7 are used for transmitting input signals and supplying power, it is possible to reduce wire resistance and to prevent a voltage drop caused by wire resistance.

Figure 3:
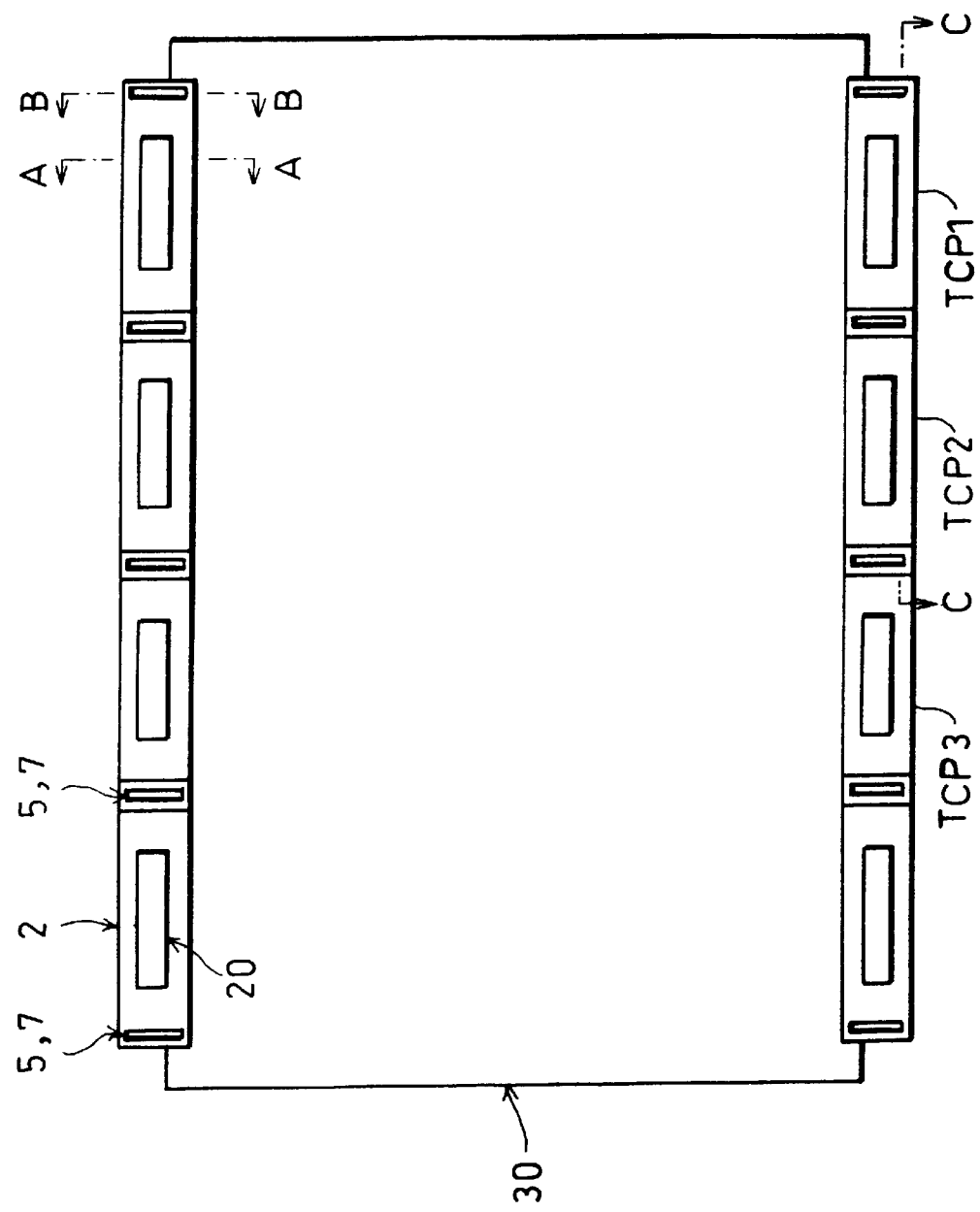
FIG. 3 is a plan view schematically showing one embodiment of a liquid crystal display device which is achieved by mounting the liquid crystal driver IC chip on the TCP and installing the TCP on a liquid crystal panel.

FIG. 3 shows one embodiment of a liquid crystal display device, in which the liquid crystal driver IC chip 20 is disposed on the TCP of the present embodiment and the TCP is mounted on the liquid crystal panel.

In the above liquid crystal display device, the output leads 4-1 through 4-*n* (shown in FIG. 1) of each TCP are connected with a liquid crystal panel 30. Further, the input leads 3-1 through 3-7 and the signal transmitting wires 6-1 through 6-7 (shown in FIG. 1) are electrically connected with one another between the TCPs via the external connection slits 5 and 7 (5-1 and 7-1, or 5-2 and 7-2). Thus, the input signals I1 through I7 (shown in FIG. 1) are transmitted via the signal transmitting wires 6-1 through 6-7.

Figure 4:
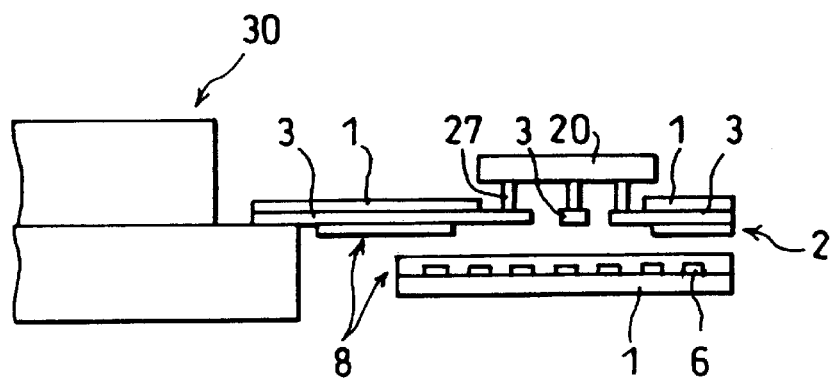
FIG. 4 is a cross section schematically showing a part where the liquid crystal driver IC chip is mounted in the liquid crystal display device of FIG. 3.
Figure 5:
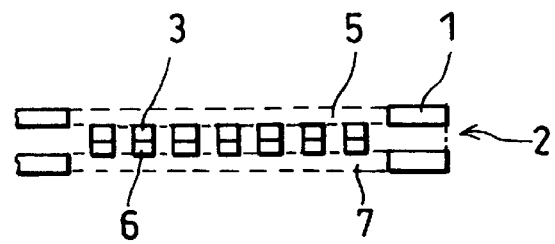
FIG. 5 is a cross section schematically showing an external connection slit disposed in the liquid crystal display device of FIG. 3.

FIG. 4 shows an A—A sectional view of the liquid crystal driver IC chip 20 of the liquid crystal display device shown in FIG. 3. Moreover, FIG. 5 shows a B—B sectional view of the external connection slits 5 and 7 of the liquid crystal display device shown in FIG. 3. Additionally, in FIGS. 4 and 5, materials including a sealing resin and solder are not shown because they do not directly relate to the present invention.

As shown in FIG. 4, in each of the TCPs, in a portion where the liquid crystal driver IC chip 20 is mounted, solder resist 8 is applied to a predetermined area (described later) inside of the TCP, and the input leads 3 (3-1 through 3-7) and the signal transmitting wires 6 (6-1 through 6-7) are electrically insulated. Meanwhile, as shown in FIG. 5, at external connection slits 5 and 7 of each of the TCPs, the input leads 3 are overlaid onto the signal transmitting wires 6, and the input leads 3 are electrically connected with the signal transmitting wires 6 by solder (not shown).

Figure 6:
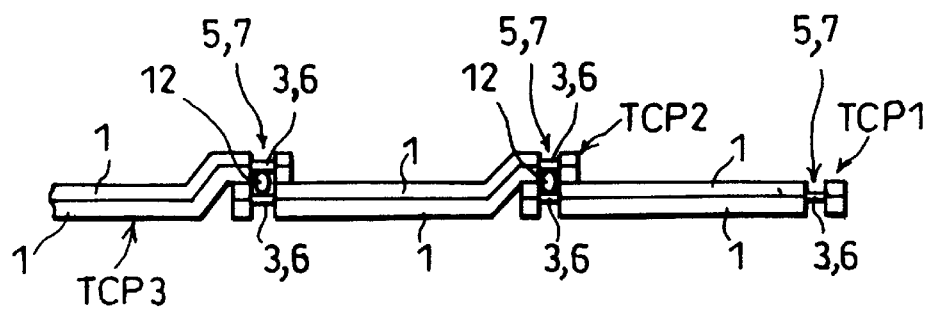
FIG. 6 is a cross section schematically showing the TCP disposed in the liquid crystal display device of FIG. 3.

Next, referring to FIG. 6, the following explanation describes how to connect the TCPs. Here, FIG. 6 is a C—C sectional view of the TCP of the liquid crystal display device shown in FIG. 3.

Firstly, as shown in FIG. 6, a plurality of TCPs are arranged so that the external connection slits 5 and 7 are overlaid to each other in each of the TCPs. Next, at a portion which is exposed through the external connection slits 5 and 7, the input leads 3 and the signal transmitting wires 6 of one TCP are electrically connected with the input leads 3 and the signal transmitting wires 6 of another TCP via solder 12. With this arrangement, the input leads 3-1 through 3-7 and the signal transmitting wires 6-1 through 6-7 are electrically connected among a plurality of TCPs. Therefore, it is possible to directly transmit the input signals I1 through I7 among a plurality of TCPs. Consequently, it is not necessary to connect a parallel connection substrate, which transmits the input signals I1 through I7, to each of the TCPs; thus, a more compact and lightweight device can be realized at lower cost.

[EMBODIMENT 2]

Figure 7:
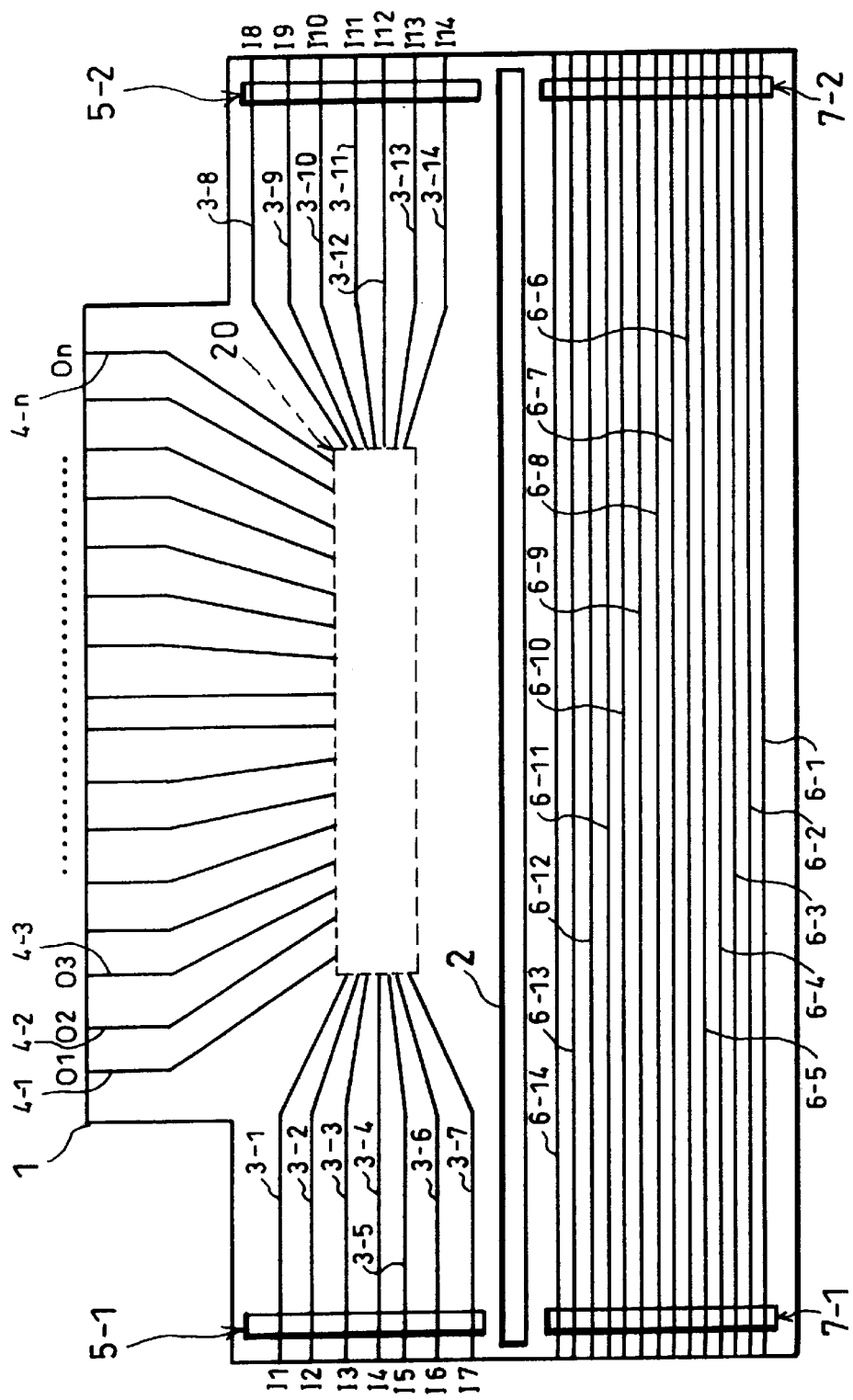
FIG. 7 is a plan view schematically showing a TCP of a second embodiment of the present invention.

Referring to FIG. 7, the following explanation describes another embodiment of the present invention. Here, for convenience of explanation, those members that have the same functions and that are described in the first embodiment are indicated by the same reference numerals and the description thereof is omitted.

As shown in FIG. 7, a TCP of the present embodiment is identical to the TCP of the first embodiment, except that: input leads 3-1 through 3-14 are provided so as to be bilaterally unsymmetrical instead of input leads 3-1 through 3-7 which are bilaterally symmetrical, and fourteen signal transmitting wires 6-1 through 6-14 are provided instead of the seven signal transmitting wires 6-1 through 6-7. Additionally, FIG. 7 shows a liquid crystal driver IC chip 20 mounted as an integrated circuit in a hollowed portion (not shown) of the TCP.

The TCP of the present embodiment is different from the TCP of the first embodiment in the following points: in the TCP of the first embodiment, the fourteen input leads 3-1 through 3-7, which input the input signals I1 through I7 to the liquid crystal driver IC chip 20, are divided by seven and extended to the right and left on the liquid crystal driver IC chip 20. The seven input leads on the external connection slit 5-1 has the same arrangement as the other seven on the external connection slit 5-2.

Meanwhile, in the TCP of the present embodiment, the fourteen input leads 3-1 through 3-14, which input the input signals I1 through I7 to the liquid crystal driver IC chip 20, are divided by seven and extended to the right and left on the liquid crystal driver IC chip 20. Further, the input leads 3-1 through 3-7 of the external connection slit 5-1 are shifted from the input leads 3-8 through 3-14 by a spacing which is half the intervals of the input leads 3-1 through 3-7.

Namely, in the TCP of the first embodiment, the input signals I1 through I7 are inputted respectively to the right and left on the liquid crystal driver IC chip 20; meanwhile, in the TCP of the present embodiment, the input signals I1 through I7 and the input signals I8 through I14 are respectively inputted to the right and left on the liquid crystal driver IC chip 20. As a result, the input signals I1 through I14, which are twice as many as those of the first embodiment can be input to the liquid crystal driver IC chip 20 by the input leads 3-1 through 3-14 formed at the same intervals as those of the first embodiment.

In the TCP of the first embodiment, the seven signal transmitting wires 6-1 through 6-7 are disposed for transmitting the input signals I1 through I7 between the left-side input leads 3-1 through 3-7 and the right-side input leads 3-1 through 3-7. On the other hand, the TCP of the present embodiment, the fourteen signal transmitting wires 6-1 through 6-14 are disposed for inputting the input signals I1 through I14 between the input leads 3-1 through 3-14 and the input leads of another TCP (not shown). Therefore, the signal transmitting wires 6-1 through 6-14 are formed at half intervals of those of the signal transmitting wires 6-1 through 6-7 of the first embodiment.

Additionally, as long as the input leads 3-1 through 3-14 of the external connection slits 5-1 and 5-2 are bilaterally unsymmetrical, the positions of the input pads of the liquid crystal driver IC chip 20 are not specified.

Next, the following explanation describes how to electrically connect the input leads 3-1 through 3-14 and the signal transmitting wires 6-1 through 6-14.

Firstly, in the TCP, solder resist is applied to a predetermined area (described later) of the surface where the input leads 3-1 through 3-14 and the signal transmitting wires 6-1 through 6-14 are formed. And then, the tape substrate 1 is folded into 180 degrees (in half) along the folding slit 2 serving as a fold so that the surface where the input leads 3-1 through 3-14 and the signal transmitting wires 6-1 through 6-14 are formed is inside of the tape substrate 1.

This arrangement makes it possible to overlay the input lead 3-1 onto the signal transmitting wire 6-2, the input lead 3-2 onto the signal transmitting wire 6-4, the input lead 3-3 onto the signal transmitting wire 6-6, the input lead 3-4 onto the signal transmitting wire 6-8, the input lead 3-5 onto the signal transmitting wire 6-10, the input lead 3-6 onto the signal transmitting wire 6-12, the input lead 3-7 onto the signal transmitting wire 6-14, the input lead 3-8 onto the signal transmitting wire 6-1, the input lead 3-9 onto the signal transmitting wire 6-3, the input lead 3-10 onto the signal transmitting wire 6-5, the input lead 3-11 onto the signal transmitting wire 6-7, the input lead 3-12 onto the signal transmitting wire 6-9, the input lead 3-13 onto the signal transmitting wire 6-11, and the input lead 3 -1 4 onto the signal transmitting wire 6 -13. Further, the external connection slit 5-1 is overlaid onto the external connection slit 7-1, and the external connection slit 5-2 is overlaid onto the external connection slit 7-2.

Moreover, at a position where the external connection slit 5-1 is overlaid onto the external connection slit 7-1, and at a position where the external connection slit 5-2 is overlaid onto the external connection slit 7-2, the input leads 3-1 through 3-7 are soldered to the signal transmitting wires 6-2, 6-4, 6-6, 6-8, 6-10, 6-12, and 6-14 so as to be electrically connected with one another. And the input leads 3-8 through 3-14 are soldered to the signal transmitting wires 6-1, 6-3, 6-5, 6-7, 6-9, 6-11, and 6-13 so as to be electrically connected with one another.

This arrangement makes it possible to transmit the input signals I1 through I14 among the TCPs by mainly using the signal transmitting wires 6-1 through 6-14 on the tape substrate 1, that has lower wire resistance as compared with the inside wires 26 of the liquid crystal driver IC chip 20. Thus, it is possible to reduce wire resistance and to prevent a voltage drop caused by wire resistance.

Here, the TCPs are connected with one another in the same manner as the TCPs of the first embodiment.

[EMBODIMENT 3]

Figure 8:
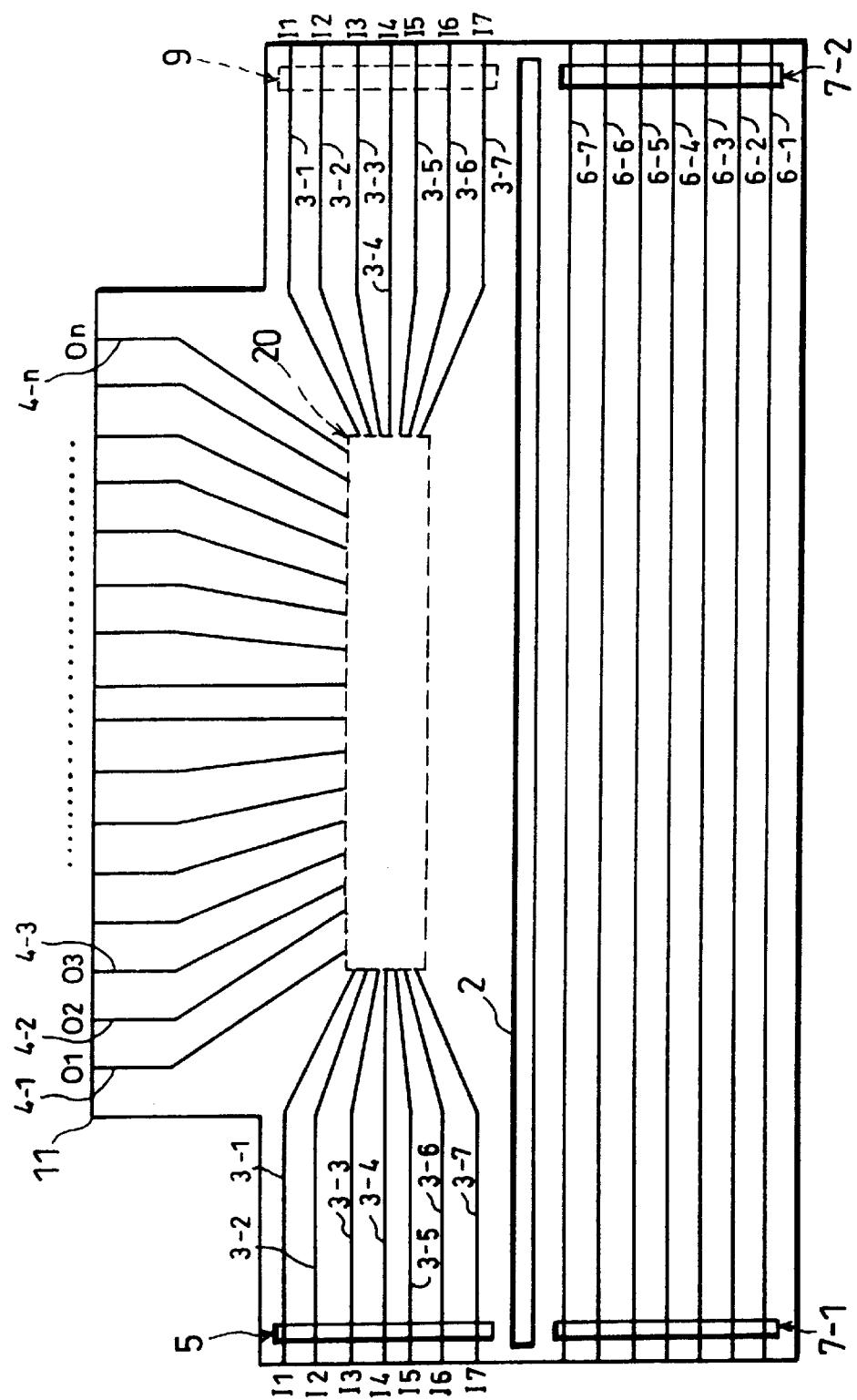
FIG. 8 is a plan view schematically showing a TCP of a third embodiment of the present invention.
Figure 9:
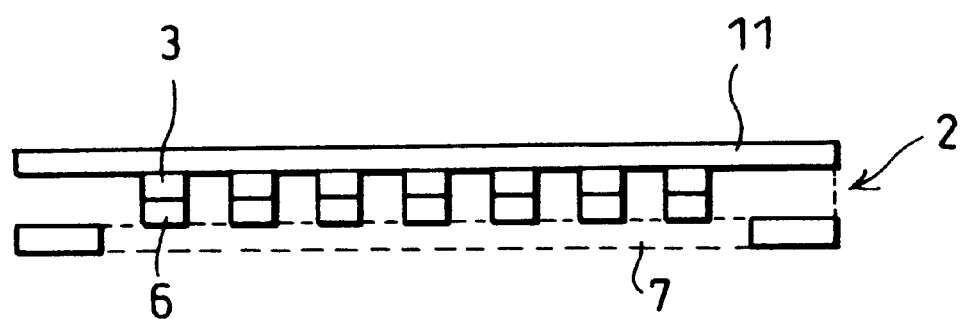
FIG. 9 is a cross section schematically showing an external connection slit of the TCP shown in FIG. 8.

Referring to FIGS. 8 and 9, the following explanation describes still another embodiment of the present invention. Here, for convenience of explanation, those members that have the same functions and that are described in the aforementioned embodiments are indicated by the same reference numerals and the description thereof is omitted.

As shown in FIG. 8, a TCP of the present embodiment is identical to the TCP of the first embodiment, except that instead of a pair of external connection slits 5-1 and 5-2 which are bilaterally symmetrical on one of the regions which are divided by a folding slit 2, an external connection slit 5 is provided and a solder resist nonapplying portion 9 is provided so as to be overlaid onto an external connection slit 7-2 of the tape substrate 11 and to be bilaterally symmetrical with the external connection slit 5. Additionally, FIG. 8 shows a liquid crystal driver IC chip 20 mounted as an integrated circuit in a hollowed portion (not shown) of the TCP.

In the TCP of the first embodiment, as shown in FIGS. 4 and 5, at the external connection slits 5 and 7 (5-1 and 7-1, or 5-2 and 7-2), the input leads 3-1 through 3-7 and the signal transmitting wires 6-1 through 6-7 are exposed on both surfaces.

However, according to the TCP of the present invention, the input leads 3-1 through 3-7 are soldered to the signal transmitting wires 6-1 through 6-7, and the input leads 3-1 through 3-7 and the signal transmitting wires 6-1 through 6-7 are soldered to the input leads and the signal transmitting wires of another TCP by holding the substrate in half, it is only required that the input leads 3-1 through 3-7 and the signal transmitting wires 6-1 through 6-7 are exposed to one surface. Namely, even when the surface which exposes the input leads 3-1 through 3-7 and the signal transmitting wires 6-1 through 6-7 and the other surface have the tape substrates, it is possible to fold the tape substrate, to solder the input leads 3-1 through 3-7 and the signal transmitting wires 6-1 through 6-7, and to solder the input leads 3-1 through 3-7 and the signal transmitting wires 6-1 through 6-7 to the input leads and the signal transmitting wires of another TCP.

Here, in the TCP of the present embodiment, the tape substrate 11 does not have the external connection slit 5-2 of the tape substrate 1 of the first embodiment. With this arrangement, when the tape substrate 11 is fold into 180 degrees along a folding slit 2 serving as a fold so as to overlay the input leads 3-1 through 3-7 onto the signal transmitting wires 6-1 through 6-7, the solder resist non-applying portion 9 of the tape substrate 11 remains in a region opposing the external connection slit 7-2. Hence, as shown in FIG. 9, at a portion which is exposed by the external connection slit 7 (7-2), the input leads 3 (3-1 through 3-7) and the signal transmitting wires 6(6-1 through 6-7) are supported by an area of the tape substrate 11 (Namely, a solder resist non-applying portion 9), that opposes the external connection slit 7, from the back of the exposed surface. As a result, as compared with the TCP of the first embodiment, it is possible to reduce occurrence of breaking of wire on the input leads 3 and the signal transmitting wires 6 at the portion which is exposed by the external connection slit 7. Therefore, without increasing the strength of the input leads 3 and the signal transmitting wires 6, it is possible to prevent breaking of wire upon handling so as to realize easy-to-handle leads and wires and to improve reliability of the electrical connection. Additionally, in FIG. 9, materials including a sealing resin and solder are not shown because they do not directly relate to the present invention.

In the TCPs of Embodiments 1 and 2, on the surface where the input leads 3-1 through 3-7 and the signal transmitting wires 6-1 through 6-7 are formed, solder resist is applied before folding the tape substrate 1, in regions other than (a) a portion where output leads 4-1 through 4-*n* (projecting portions of the upper ends shown in FIGS. 1 and 7) are exposed for outputting output signals O1 through On, the portion connecting tape substrate with a liquid crystal panel, (b) a hollowed portion (not shown) disposed for mounting the liquid crystal driver IC chip 20 at a position corresponding to the liquid crystal driver IC chip 20 of the tape substrate 1, (c) the input leads 3-1 through 3-7 disposed on the external connection slits 5-1 and 5-2, and (d) the signal transmitting wires 6-1 through 6-7 disposed on the external connection slits 7-1 and 7-2.

Meanwhile, the TCP of the present embodiment, on the surface where the input leads 3-1 through 3-7 and the signal transmitting wires 6-1 through 6-7 are formed, solder resist is applied before folding the tape substrate 1, in regions other than (a) a portion where output leads 4-1 through 4-*n* (projecting portions of the upper ends shown in FIG. 8) are exposed for outputting output signals O1 through On, the portion connecting tape substrate with the liquid crystal panel, (b) a hollowed portion(not shown) disposed for mounting the liquid crystal driver IC chip 20 at a position corresponding to the liquid crystal driver IC chip 20 of the tape substrate 11, (c) the input leads 3-1 through 3-7 disposed on the external connection slit 5, (d) the signal transmitting wires 6-1 through 6-7 disposed on the external connection slits 7-1 and 7-2, (e) the solder resist non-applying portion 9, and (f) input leads 3-1 through 3-7 disposed on the solder resist non-applying portion 9.

It is possible to electrically connect the input leads 3-1 through 3-7 to the signal transmitting wires 6-1 through 6-7 in the same manner as the first embodiment. Firstly, in the TCP, solder resist is applied to the region of the surface where the input leads 3-1 through 3-7 and the signal transmitting wires 6-1 through 6-7 are formed, and then, the tape substrate 11 is folded into 180 degrees along the folding slit 2 serving as a fold so that the surface where the input leads 3-1 through 3-7 and the signal transmitting wires 6-1 through 6-7 are formed is inside of the tape substrate 11. Thus, the input leads 3-1 through 3-7 and the signal transmitting wires 6-1 through 6-7 overlay each other. Moreover, the external connection slits 5 and the external connection slit 7-1 overlay each other, and the solder resist non-applying portion 9 and the external connection slit 7-2 overlay each other.

Further, at a position where the external connection slit 5 and the external connection slit 7-1 overlay each other, and at a position where the solder resist non-applying portion 9 and the external connection slit 7-2 overlay each other, the input leads 3-1 through 3-7 and the signal transmitting wires 6-1 through 6-7 are soldered so as to be electrically connected with one another. This arrangement makes it possible to input the input signals I1 through I7 by mainly using the signal transmitting wires 6-1 through 6-7 of the tape substrate 11, that has lower wire resistance as compared with the inside wires 26 of the liquid crystal driver IC chip 20. Therefore, it is possible to reduce wire resistance and to prevent a voltage drop caused by wire resistance.

Further, the TCPs are connected with one another as follows: firstly, a plurality of TCPs are arranged so as to overlay the external connection slit 7-2 of one TCP onto the external connection slits 5 and 7-1 of another TCP. Next, at a portion exposed by the external connection slits 5, 7-1, and 7-2, the input leads 3-1 through 3-7 and the signal transmitting wires 6-1 through 6-7 of the TCP are electrically connected with the input leads 3-1 through 3-7 and the signal transmitting wires 6-1 through 6-7 of another TCP by soldering. With this arrangement, the input leads 3-1 through 3-7 and the signal transmitting wires 6-1 through 6-7 are electrically connected among a plurality of TCPs.

[EMBODIMENT 4]

Figure 10:
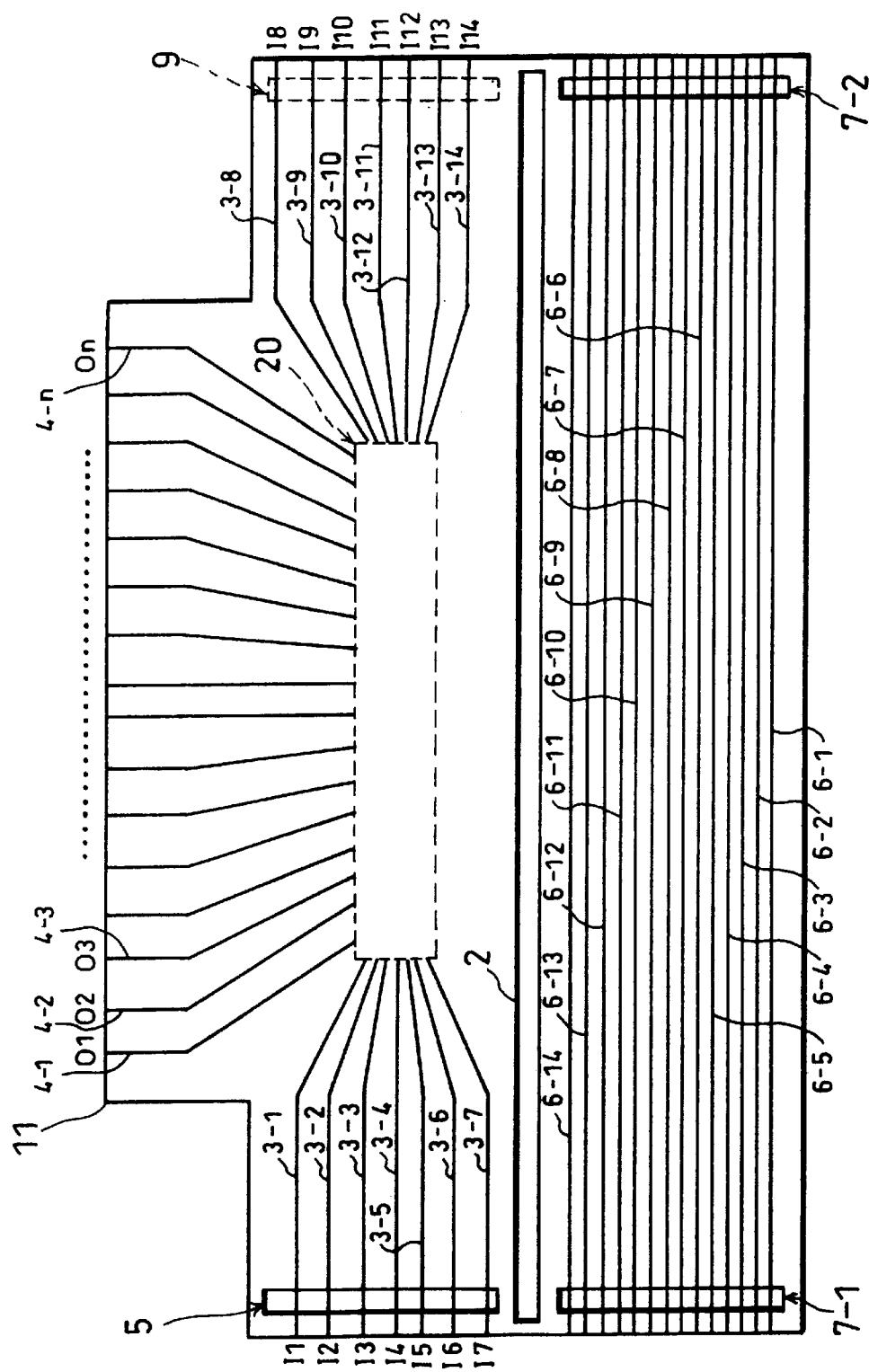
FIG. 10 is a plan view schematically showing a TCP of a fourth embodiment of the present invention.

Referring to FIG. 10, the following explanation describes still another embodiment of the present invention. Here, for convenience of explanation, those members that have the same functions and that are described in the aforementioned embodiments are indicated by the same reference numerals and the description thereof is omitted.

As shown in FIG. 10, a TCP of the present embodiment is identical to the TCP of the third embodiment, except that:

input leads 3-1 through 3-14 of a TCP of the second embodiment are provided so as to be bilaterally unsymmetrical instead of bilaterally symmetrical input leads 3-1 through 3-7, and fourteen signal transmitting wires 6-1 through 6-14 of the second embodiment are provided instead of seven signal transmitting wires 6-1 through 6-7. Additionally, FIG. 10 shows a liquid crystal driver IC chip 20 mounted in a hollowed portion (not shown) of the TCP as an integrated circuit.

In the TCP of the third embodiment, the input signals I1 through I7 are inputted to the right and left of the liquid crystal driver IC chip 20. In contrast, according to the TCP of the present embodiment, the input signals I1 through I7 and the input signals I8 through I14 are respectively inputted to the right and left of the liquid crystal driver IC chip 20. As a result, the input signals I1 through I14, which are twice as many as those of the third embodiment can be input to the liquid crystal driver IC chip 20 by the input leads 3-1 through 3-14 formed at the same intervals as those of the first embodiment.

Additionally, the positions of the input pads of the liquid crystal driver IC chip 20 are not particularly specified.

It is possible to electrically connect the input leads 3-1 through 3-14 to the signal transmitting wires 6-1 through 6-14, in the same manner as the second embodiment. Firstly, in the same manner as the third embodiment, solder resist is applied, and then, a tape substrate 11 is folded into 180 degrees along a folding slit 2 serving as a fold so that the surface where the input leads 3-1 through 3-14 and the signal transmitting wires 6-1 through 6-14 are formed is inside of the tape substrate 11.

With this arrangement, the input leads 3-1 through 3-7 are overlaid onto the signal transmitting wires 6-2, 6-4, 6-6, 6-8, 6-10, 6-12, and 6-14, the input leads 3-8 through 3-14 are overlaid onto the signal transmitting wires 6-1, 6-3, 6-5, 6-7, 6-9, 6-11, and 6-13. Further, an external connection slit 5 is overlaid onto an external connection slit 7-1, and the a solder resist non-applying portion 9 is overlaid onto an external connection slit 7-2.

Moreover, at a position where the external connection slit 5 is overlaid onto the external connection slit 7-1, and at a position where the solder resist non-applying portion 9 is overlaid onto the external connection slit 7-2, the input leads 3-1 through 3-7 are soldered so as to be electrically connected to the signal transmitting wires 6-2, 6-4, 6-6, 6-8, 6-10, 6-12, 6-14; and the input leads 3-8 through 3-14 are soldered so as to be electrically connected to the signal transmitting wires 6-1, 6-3, 6-5, 6-7, 6-9, 6-11, and 6-13.

With this arrangement, the input signals I1 through I14 are transmitted among the TCPs by using mainly the signal transmitting wires 6-1 through 6-14 of the substrate 11, that has lower wire resistance as compared with inside wires 26 of the liquid crystal driver IC chip 20. Therefore, it is possible to reduce wire resistance and to prevent a voltage drop caused by wire resistance.

The TCPs are connected with one another in the same manner as the TCPs of the third embodiment.

[EMBODIMENT 5]

Figure 11:
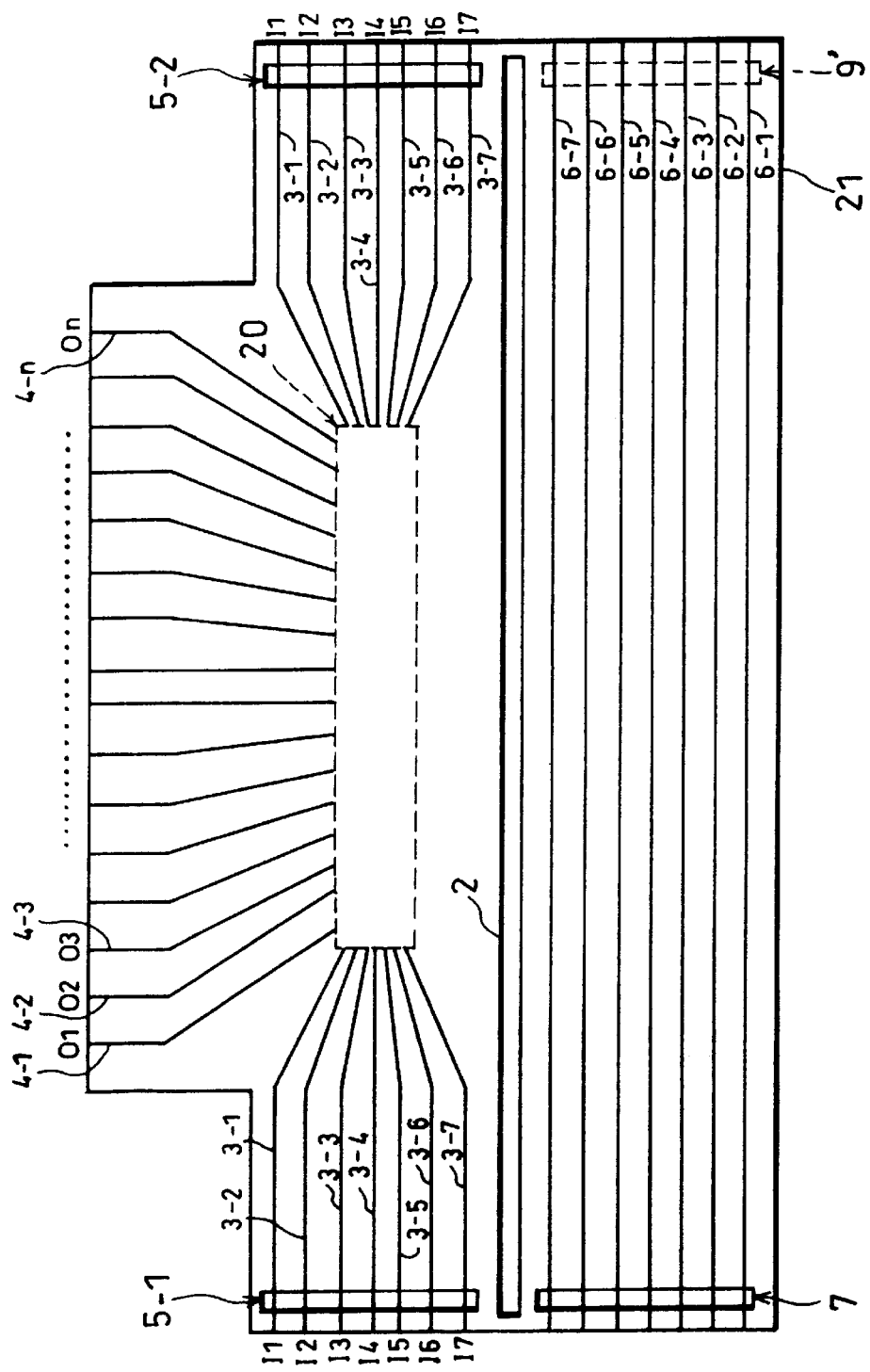
FIG. 11 is a plan view schematically showing a TCP of a fifth embodiment of the present invention.

Referring to FIG. 11, the following explanation describes still another embodiment of the present invention. Here, for convenience of explanation, those members that have the same functions and that are described in the aforementioned embodiments are indicated by the same reference numerals and the description thereof is omitted.

As shown in FIG. 11, a TCP of the present embodiment is identical to the TCP of the first embodiment, except that: an external connection slit 7 is provided instead of a pair of external connection slits 7-1 and 7-2 which are bilaterally symmetrical, on one of the regions which are divided by a folding slit 2 of a tape substrate 21; and a solder resist non-applying portion 9' is provided so as to be overlaid onto an external connection slit 5-2 of the tape substrate 21 and to be bilaterally symmetrical with the external connection slit 7. Additionally, FIG. 11 shows a liquid crystal driver IC chip 20 mounted in a hollowed portion (not shown) of the TCP as an integrated circuit.

Here, in the TCP of the present embodiment, the tape substrate 21 does not include the external connection slit 7-2 of the tape substrate 1 of the first embodiment. With this arrangement, when the tape substrate 21 is folded into 180 degrees along a folding slit 2 serving as a fold so as to overlay the input leads 3-1 through 3-7 onto the signal transmitting wires 6-1 through 6-7, at a portion which is exposed by the external connection slit 5-2, the input leads 3-1 through 3-7 and the signal transmitting wires 6-1 through 6-7 are supported by an area of the tape substrate 21 (namely, the solder resist non-applying portion 9') that opposes the external connection slit 5-2, from the back of the exposed surface. As a result, as compared with the TCP of the first embodiment, it is possible to reduce breaking of wire on the input leads 3-1 through 3-7 and the signal transmitting wires 6-1 through 6-7 at the portion which is exposed by the external connection slit 5-2. Therefore, it is possible to prevent breaking of wire upon handling so as to realize easy-to-handle leads and wires and to improve reliability of the electrical connection.

In the TCP of the present embodiment, on the surface where the input leads 3-1 through 3-7 and the signal transmitting wires 6-1 through 6-7 are formed, solder resist is applied before folding the tape substrate 21, in regions other than a portion where output leads 4-1 through 4-n are exposed, a hollowed portion disposed for mounting the liquid crystal driver IC chip 20, the input leads 3-1 through 3-7 disposed on the external connection slits 5-1 and 5-2, the signal transmitting wires 6-1 through 6-7 disposed on the external connection slit 7, the solder resist non-applying portion 9', and the signal transmitting wires 6-1 through 6-7 disposed on the solder resist non-applying portion 9'.

It is possible to electrically connect the input leads 3-1 through 3-7 to the signal transmitting wires 6-1 through 6-7 in the same manner as the first embodiment. Firstly, in the TCP, solder resist is applied to the region of the surface where the input leads 3-1 through 3-7 and the signal transmitting wires 6-1 through 6-7 are formed, and then, the tape substrate 21 is folded into 180 degrees along the folding slit 2 serving as a fold so that the surface where the input leads 3-1 through 3-7 and the signal transmitting wires 6-1 through 6-7 are formed is inside of the tape substrate 21. Thus, the input leads 3-1 through 3-7 and the signal transmitting wires 6-1 through 6-7 are overlaid with each other. Moreover, the external connection slits 5-1 and the external connection slit 7-1 are overlaid to each other, and the solder resist non-applying portion 9' and the external connection slit 5-2 are overlaid to each other.

Further, at a position where the external connection slit 5-1 and the external connection slit 7 are overlaid to each other, and at a position where the solder resist non-applying portion 9' and the external connection slit 5-2 are overlaid to each other, the input leads 3-1 through 3-7 and the signal transmitting wires 6-1 through 6-7 are soldered so as to be electrically connected with each other. This arrangement makes it possible to input the input signals I1 through I7 by mainly using the signal transmitting wires 6-1 through 6-7 of the tape substrate 21, that has lower wire resistance as compared with the inside wire 26 of the liquid crystal driver IC chip 20. Therefore, it is possible to reduce wire resistance and to prevent a voltage drop caused by wire resistance.

Further, the TCPs are connected with one another as follows: firstly, a plurality of TCPs are arranged so as to overlay the external connection slit 5-2 of one TCP onto the external connection slits 5-1 and 7 of another TCP. Next, at a portion exposed by the external connection slits 5-1, 5-2, and 7, the input leads 3-1 through 3-7 and the signal transmitting wires 6-1 through 6-7 of one TCP are electrically connected with the input leads 3-1 through 3-7 and the signal transmitting wires 6-1 through 6-7 of another TCP by soldering. With this arrangement, the input leads 3-1 through 3-7 and the signal transmitting wires 6-1 through 6-7 are electrically connected among a plurality of TCPs.

[EMBODIMENT 6]

Figure 12:
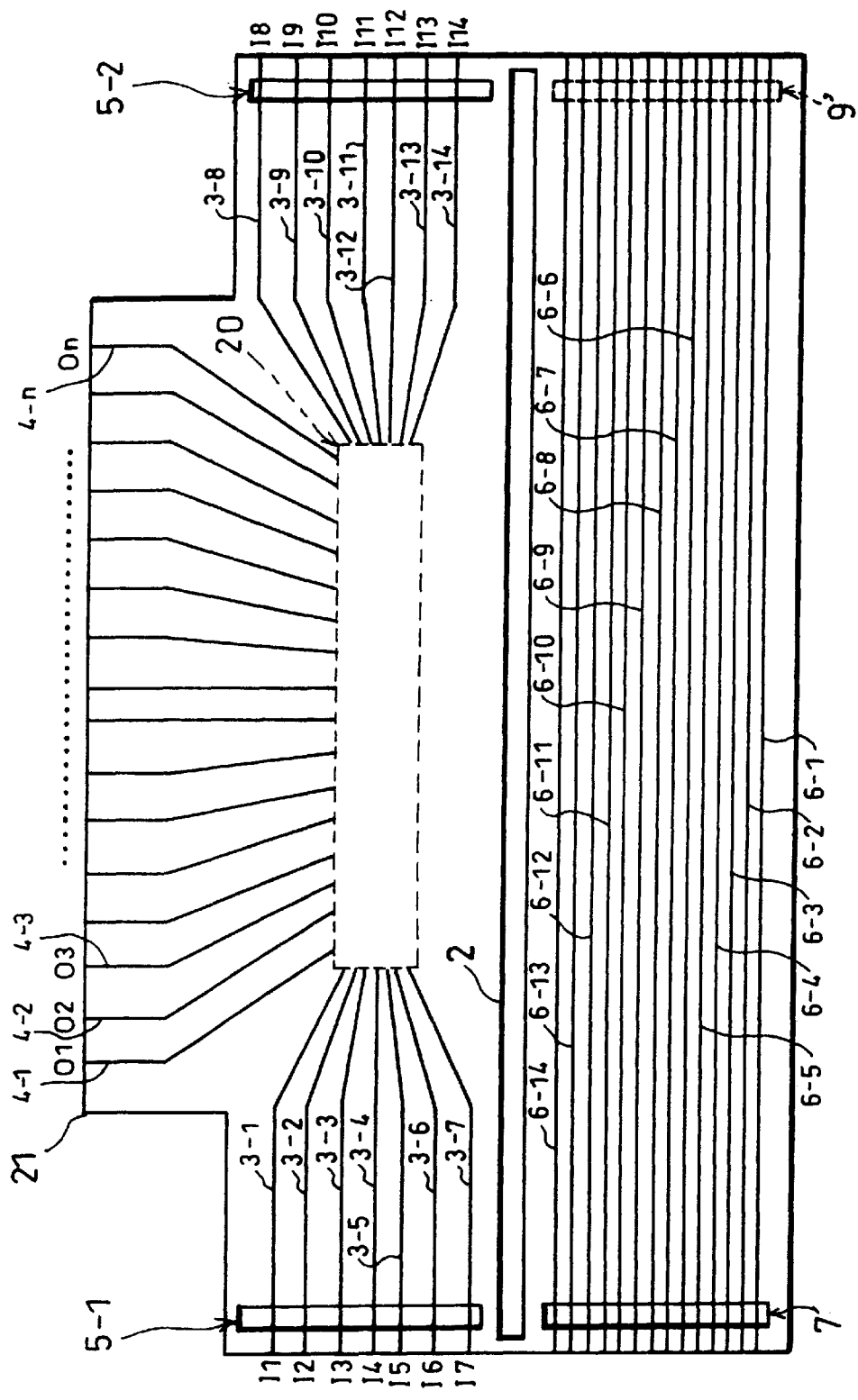
FIG. 12 is a plan view schematically showing a TCP of a sixth embodiment of the present invention.

Referring to FIG. 12, the following explanation describes still another embodiment of the present invention. Here, for convenience of explanation, those members that have the same functions and that are described in the aforementioned embodiments are indicated by the same reference numerals and the description thereof is omitted.

As shown in FIG. 12, a TCP of the present embodiment is identical to the TCP of the fifth embodiment, except that: input leads 3-1 through 3-14 of the TCP of the second embodiment are provided so as to be bilaterally unsymmetrical instead of bilaterally symmetrical input leads 3-1 through 3-7, and fourteen signal transmitting wires 6-1 through 6-14 of the second embodiment are provided instead of seven signal transmitting wires 6-1 through 6-7. Additionally, FIG. 12 shows a liquid crystal driver IC chip 20 mounted in a hollowed portion (not shown) of the TCP as an integrated circuit.

In the TCP of the fifth embodiment, the input signals I1 through I7 are inputted to the right and left of the liquid crystal driver IC chip 20. In contrast, according to the TCP of the present embodiment, the input signals I1 through I7 and the input signals I8 through I14 are respectively inputted to the right and left of the liquid crystal driver IC chip 20. As a result, the input signals I1 through I14, which are twice as many as those of the third embodiment, can be input to the liquid crystal driver IC chip 20 by the input leads 3-1 through 3-14 formed at the same intervals as those of the first embodiment. Additionally, the positions of the input pads of the liquid crystal driver IC chip 20 are not particularly specified.

It is possible to electrically connect the input leads 3-1 through 3-14 and the signal transmitting wires 6-1 through 6-14, in the same manner as the second embodiment. Firstly, in the same manner as the fifth embodiment, solder resist is applied, and then, a tape substrate 21 is folded into 180 degrees along a folding slit 2 serving as a fold so that the surface where the input leads 3-1 through 3-14 and the signal transmitting wires 6-1 through 6-14 are formed is inside of the tape substrate 21.

With this arrangement, the input leads 3-1 through 3-7 are overlaid onto the signal transmitting wires 6-2, 6-4, 6-6, 6-8, 6-10, 6-12, and 6-14, the input leads 3-8 thorough 3-14 are overlaid onto the signal transmitting wires 6-1, 6-3, 6-5, 6-7, 6-9, 6-11, and 6-13. Further, an external connection slit 5-1 is overlaid onto an external connection slit 7, and a solder resist non-applying portion 9' is overlaid onto an external connection slit 5-2.

Moreover, at a position where the external connection slit 5-1 is overlaid onto the external connection slit 7, and at a position where the solder resist non-applying portion 9' is overlaid onto the external connection slit 5-2, the input leads 3-1 through 3-7 are soldered so as to be electrically connected to the signal transmitting wires 6-2, 6-4, 6-6, 6-8, 6-10, 6-12, and 6-14; and the input leads 3-1 through 3-14 are soldered so as to be electrically connected to the signal transmitting wires 6-1, 6-3, 6-5, 6-7, 6-9, 6-11, and 6-13.

With this arrangement, the input signals I1 through I14 are transmitted among the TCPs by using mainly the signal transmitting wires 6-1 through 6-14 of the substrate 21, which have lower wire resistance as compared with inside wires 26 of the liquid crystal driver IC chip 20. Therefore, it is possible to reduce wire resistance and to prevent a voltage drop caused by wire resistance.

The TCPs are connected with one another in the same manner as the TCPs of the fifth embodiment.

Here, in the TCPs of embodiments 3 through 6, the solder resist non-applying portions 9 and 9' are disposed on the right ends of the tape substrates 11 and 21; however, it is also allowed to dispose the solder resist non-applying portions 9 and 9' on the left ends of the tape substrates 11 and 21.

Moreover, it is possible to provide the solder resist non-applying portion on each of the right and left ends of the tape substrate. Namely, for example, instead of the external connection slit (7-1 or 5-1) which is diagonally opposite to the solder resist non-applying portion (9 or 9') in embodiments 3 through 6, another solder resist non-applying portion can be provided.

Here, a plurality of solder resist non-applying portions are diagonally opposite to one another because, as shown in FIG. 6, the TCPs are connected with one another by overlaying the upper surface of the left end of one TCP, which is positioned to the right of another TCP, onto the bottom surface of the right end of another TCP, which is positioned to the left, or by overlaying the bottom surface of the left end of one TCP, which is positioned to the right of another TCP, onto the upper surface of the right end of a TCP, which is positioned to the left.

Further, in embodiments 1 through 6, the tape substrates 1, 11, and 21 are folded so that the surface where the liquid crystal driver IC chip 20 is disposed is outside the tape substrates. However, it is possible to change an arrangement for connecting to a liquid crystal panel 30 or a method for mounting the liquid crystal driver IC chip 20 on the TCP, so that the tape substrates 1, 11, and 21 can be folded so that the surface where the liquid crystal driver IC chip 20 is disposed is inside the substrates.

[EMBODIMENT 7]

Referring to FIGS. 13 through 16, the following explanation describes still another embodiment of the present invention. Here, for convenience of explanation, those members that have the same functions and that are described in the aforementioned embodiments are indicated by the same reference numerals and the description thereof is omitted.

Figure 13:
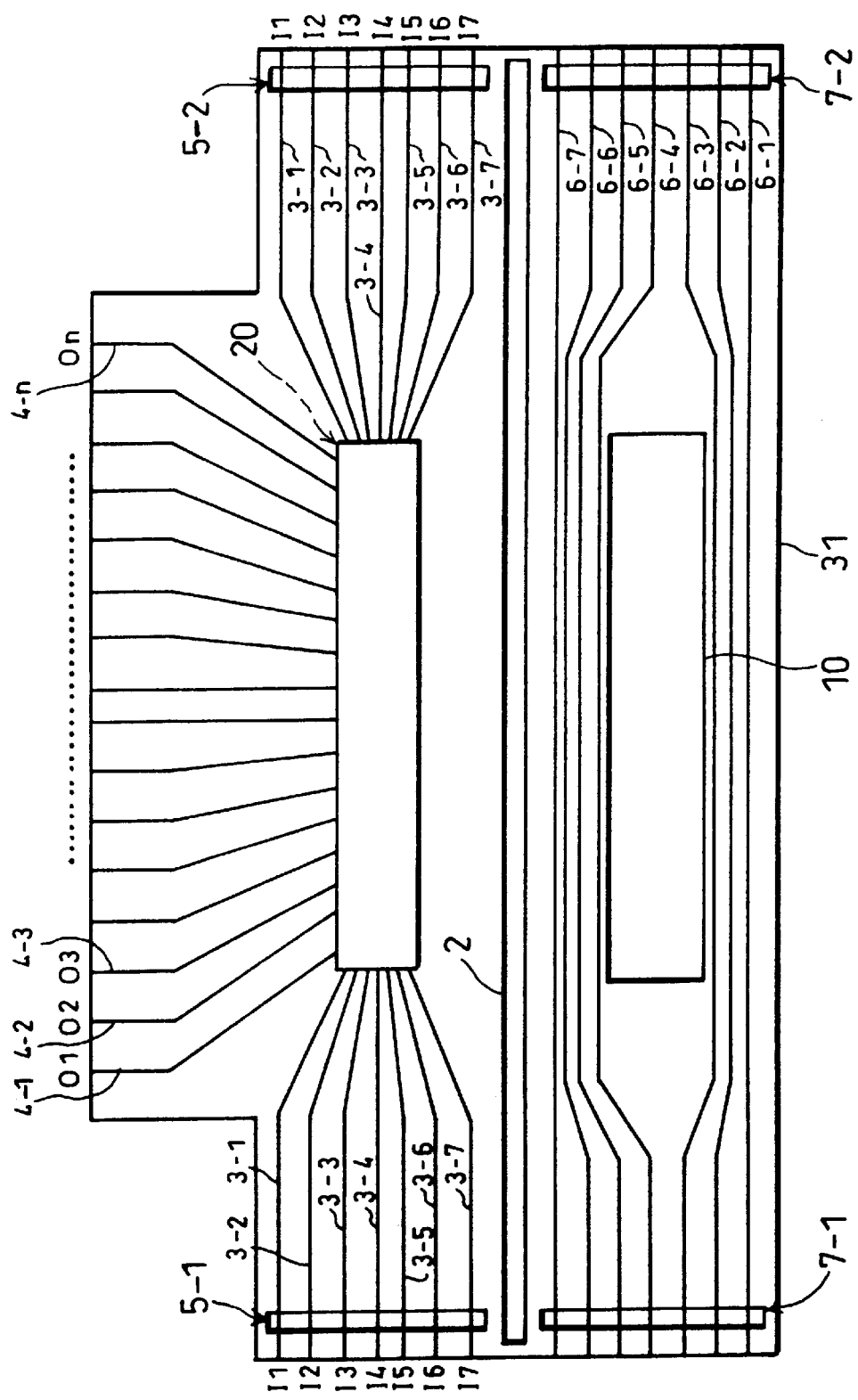
FIG. 13 is a plan view schematically showing a TCP of a seventh embodiment of the present invention.

As shown in FIG. 13, unlike the tape substrate of the first embodiment, a TCP of the present embodiment is provided with a tape substrate 31 having a chip hole 10 (opening) for inserting a liquid crystal driver IC chip 20. The TCP of the present embodiment is identical to the TCP of the first embodiment, except that the liquid crystal driver IC chip 20 is mounted on the surface where the input leads 3-1 through 3-7 are disposed.

The chip hole 10 is disposed so as to be overlaid onto the liquid crystal driver IC chip 20, when the liquid crystal driver IC chip 20 is mounted and the surface where the liquid crystal driver IC chip 20 is mounted is folded into 180 degrees along a folding slit 2 serving as a fold.

As for the tape substrate 1 without the chip hole 10, in the case when the liquid crystal driver IC chip 20 is provided on the surface where the input leads 3 are disposed and the tape substrate 1 is folded into 180 degrees so as to allow the surface where the input leads 3 are disposed to be inside of the substrate 1, it is not possible to bring the tape substrate 1 into intimate contact due to a thickness of the liquid crystal driver chip 20.

Figure 14:
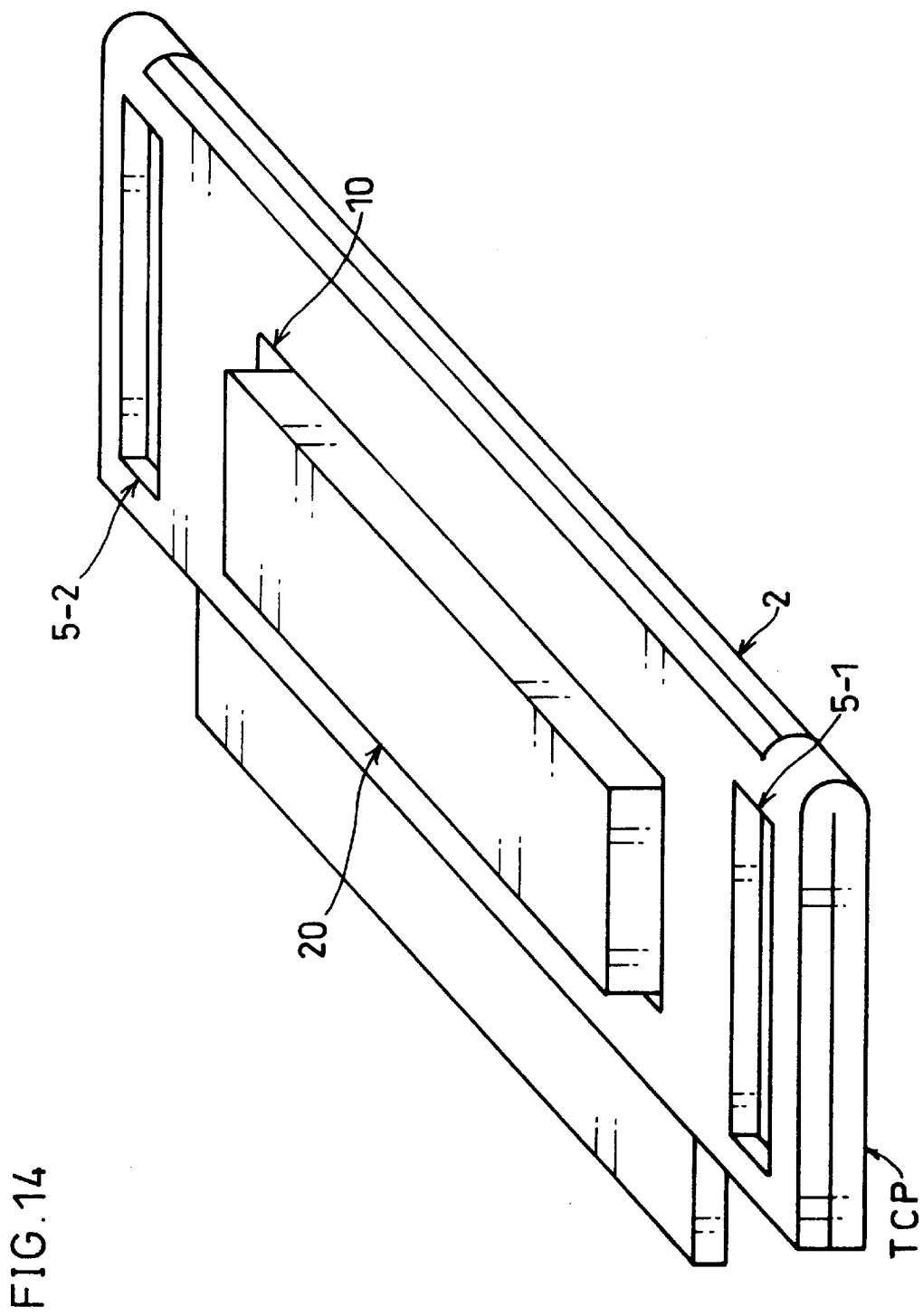
FIG. 14 is a perspective view schematically showing the TCP of FIG. 13 that is folded into 180 degrees.

In the TCP of the present embodiment, when the tape substrate 31 is folded into 180 degrees along the folding slit 2 serving as a fold so that the surface where the liquid crystal driver IC chip 20 is mounted is inside of the tape substrate 31, as shown in FIG. 14, the liquid crystal driver IC chip 20 penetrates the chip hole 10, so that regardless of the thickness of the liquid crystal driver chip 20, it is possible to fold the tape substrate 31 into 180 degrees so as to bring the tape substrate 31 into intimate contact without a gap.

Therefore, the tape substrate 31 can be folded into a compact substrate. Further, it is possible to prevent a gap of the tape substrate 31, that is caused by the thickness of the liquid crystal driver IC chip 20, from damaging the tape substrate 31, the wires disposed on the substrate 31, and an inner lead portion connected with the liquid crystal driver IC chip 20; consequently, a reliable TCP can be provided. Moreover, as compared with the TCP of the first embodiment, it is possible to realize a smaller thickness of the TCP upon mounting the liquid crystal driver IC chip 20.

Figure 15:
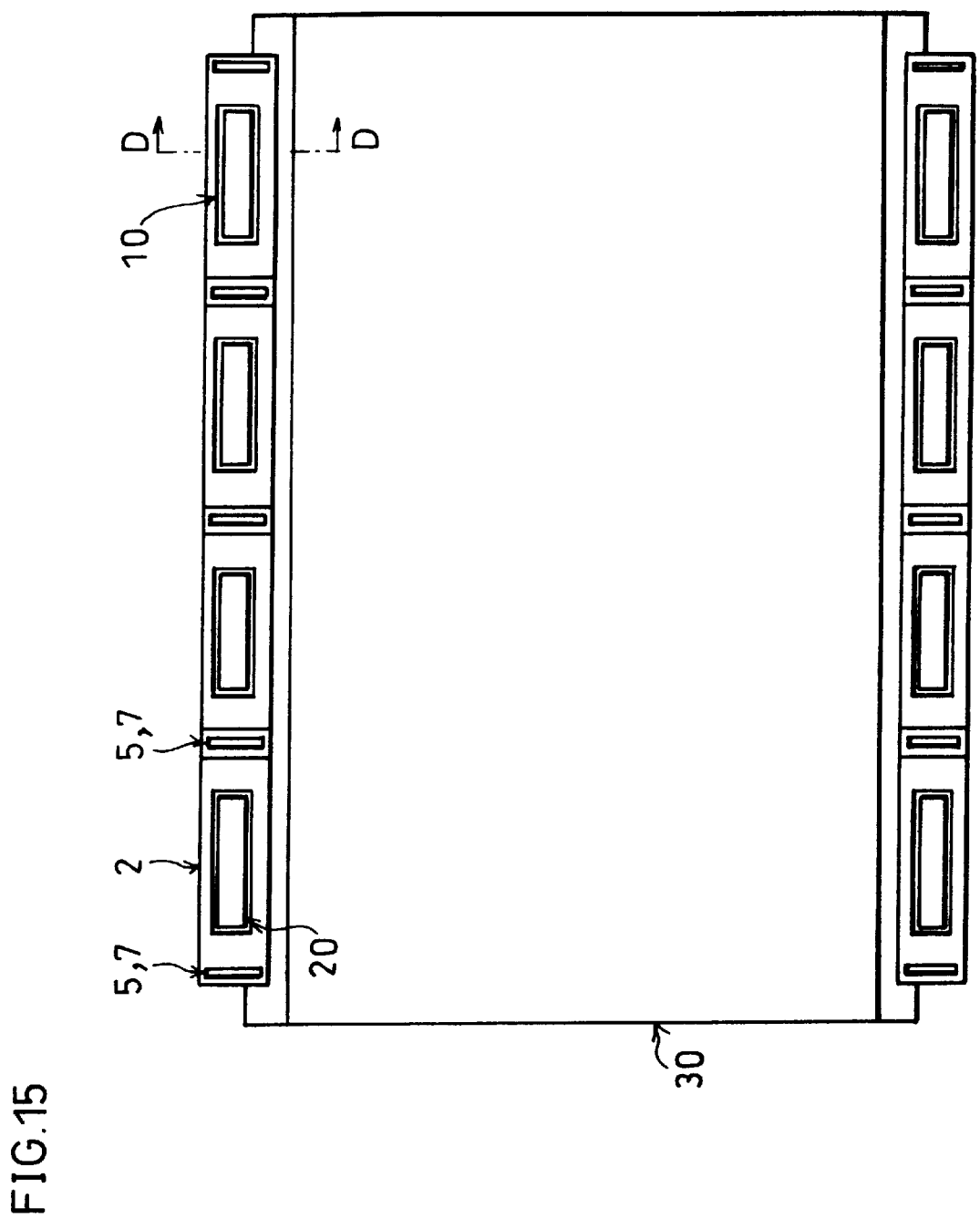
FIG. 15 is a plan view schematically showing one embodiment of a liquid crystal display device which is achieved by mounting a liquid crystal driver IC chip on the TCP of FIG. 13 and installing the TCP on a liquid crystal panel.

FIG. 15 shows one embodiment of a liquid crystal display device, in which the liquid crystal driver IC chip 20 is mounted on the TCP of the present embodiment and the TCP is installed on a liquid crystal panel.

In the above-mentioned liquid crystal display device, the output leads 4-1 through 4-n (shown in FIG. 13) of each of the TCPs are connected with a liquid crystal panel 30. Further, among the TCPs, the input leads 3-1 through 3-7 and signal transmitting wires 6-1 through 6-7 (shown in FIG. 13) are electrically connected with one another via external connection slits 5 and 7 (5-1 and 7-1, or 5-2 and 7-2). This arrangement makes it possible to transmit input signals I1 through I7 (shown in FIG. 13) via the signal transmitting wires 6-1 through 6-7.

Figure 16:
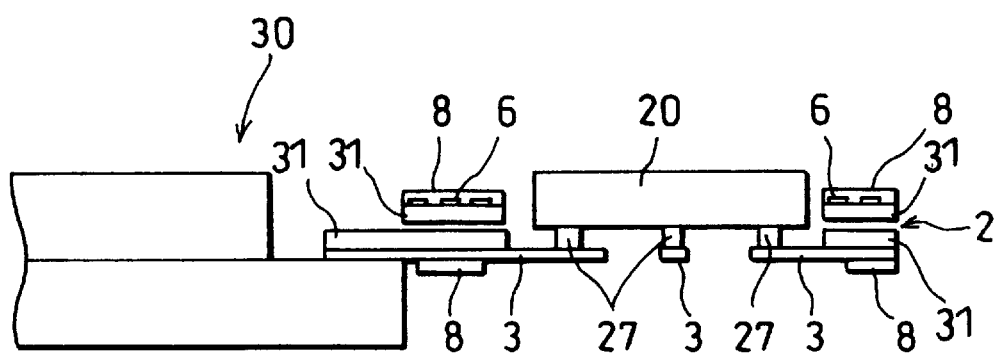
FIG. 16 is a cross section schematically showing a part where the liquid crystal driver IC chip is mounted in the liquid crystal display device of FIG. 15.

FIG. 16 shows a D—D sectional view of a portion of the liquid crystal display device shown in FIG. 15, that includes the liquid crystal driver IC chip 20. Here, FIG. 16 does not show materials including a sealing resin and solder, which do not directly relate to the present invention.

As shown in FIG. 16, in a portion where the liquid crystal driver IC chip 20 is mounted in each of the TCPs, a solder resist 8 is applied to a predetermined portion (described later) inside the TCP. The input leads 3(3-1 through 3-7) and the signal transmitting wires 6 (6-1 through 6-7) are electrically insulated. Meanwhile, at the external connection slits 5 and 7 of each of the TCP, the input leads 3 and the signal transmitting wires 6 are overlaid to one another and are electrically connected with one another by soldering (not shown).

Further, in the same manner as the first embodiment, the input leads 3-1 through 3-7 and the signal transmitting wires 6-1 through 6-7 are electrically connected among a plurality of the TCPs. Thus, it is possible to directly input the input signals I1 through I7 among a plurality of the TCPs. As a result, it is not necessary to connect a parallel connection substrate for transmitting the input signals I1 through I7 to each of the TCPs; consequently, it is possible to realize a more compact and lightweight device at lower cost.

[EMBODIMENT 8]

Figure 17:
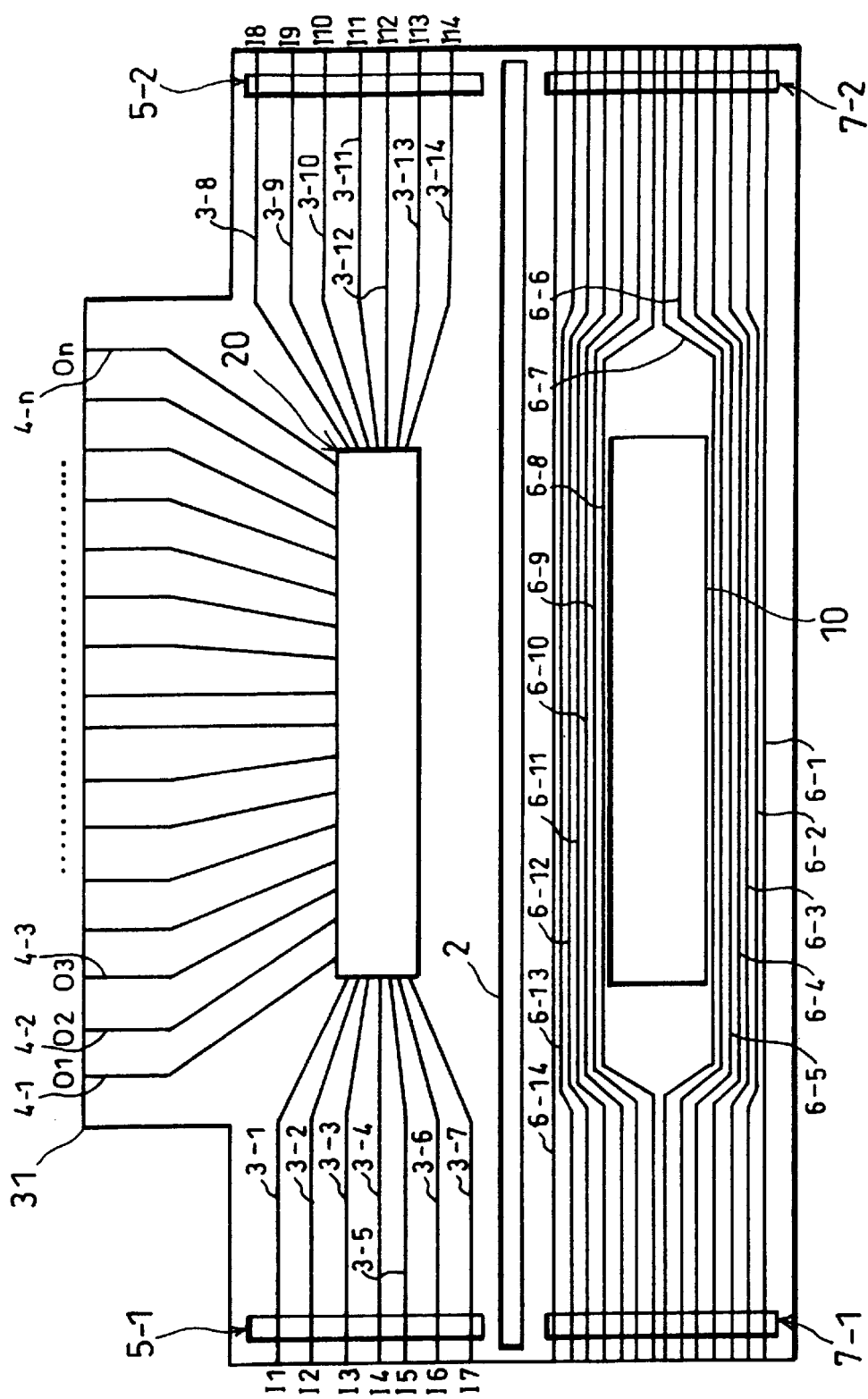
FIG. 17 is a plan view schematically showing a TCP of an eighth embodiment of the present invention.

Referring to FIG. 17, the following explanation describes still another embodiment of the present invention. Here, for convenience of explanation, those members that have the same functions and that are described in the aforementioned embodiments are indicated by the same reference numerals and the description thereof is omitted.

As shown in FIG. 17, a TCP of the present embodiment is identical to the TCP of the second embodiment, except that: the tape substrate 31 of the seventh embodiment is provided instead of the tape substrate 1 of the second embodiment, and a liquid crystal driver IC chip 20 is mounted on a surface where input leads 3-1 through 3-14 are provided. This arrangement makes it possible to achieve the same effect as the seventh embodiment.

[EMBODIMENT 9]

Figure 18:
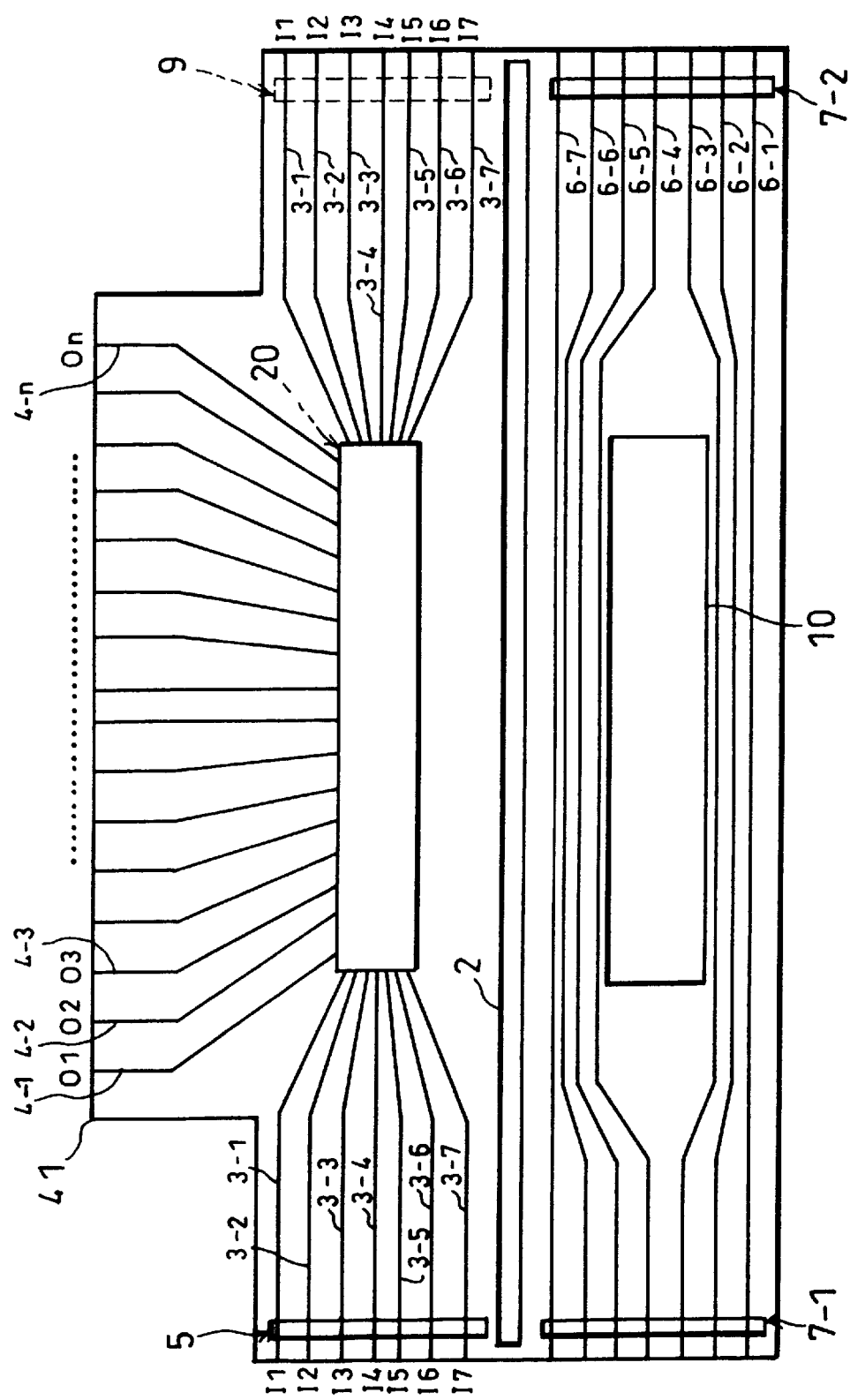
FIG. 18 is a plan view schematically showing a TCP of a ninth embodiment of the present invention.

Referring to FIG. 18, the following explanation describes still another embodiment of the present invention. Here, for convenience of explanation, those members that have the same functions and that are described in the aforementioned embodiments are indicated by the same reference numerals and the description thereof is omitted.

As shown in FIG. 18, a TCP of the present embodiment is identical to the TCP of the third embodiment, except that: unlike the tape substrate 11 of the third embodiment, a tape substrate 41 is provided so as to include a chip hole 10 for inserting a liquid crystal driver IC chip 20 and the liquid crystal driver IC chip 20 is mounted on a surface where input leads 3-1 through 3-17 are provided.

Therefore, regardless of the thickness of the liquid crystal driver chip 20, it is possible to fold the tape substrate 41 into 180 degrees without a gap so that the surface where the liquid crystal driver IC chip 20 is mounted is inside the tape substrate 41. Thus, the tape substrate 41 can be folded into a compact substrate, and it is possible to prevent a damage occurring on the tape substrate 41, the wires on the tape substrate 41, and an inner lead portion connected with the liquid crystal driver IC chip 20. Further, as compared with the TCP of the third embodiment, it is possible to realize a smaller thickness of the TCP upon mounting the liquid crystal driver IC chip 20.

[EMBODIMENT 10]

Figure 19:
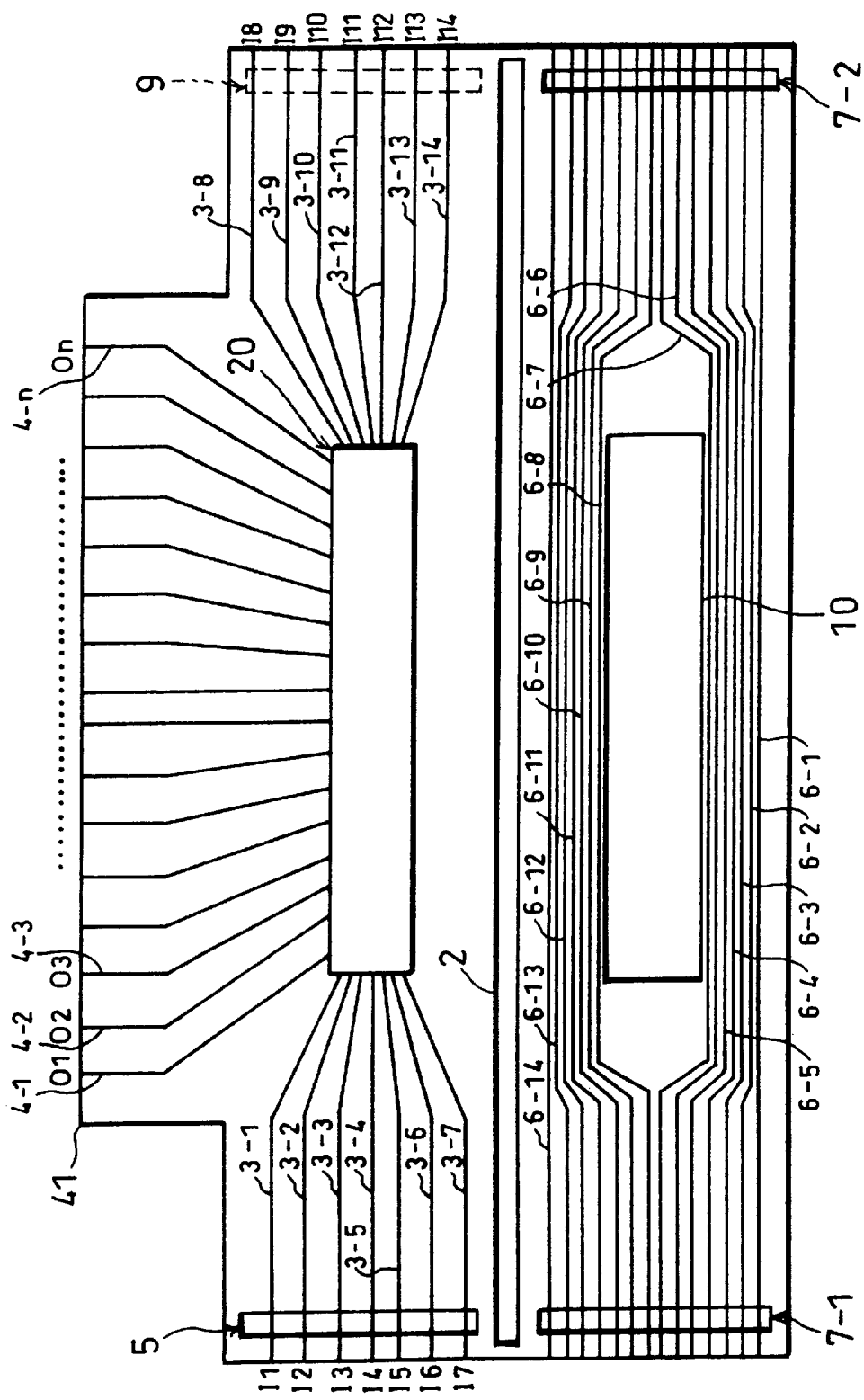
FIG. 19 is a plan view schematically showing a TCP of a tenth embodiment of the present invention.

Referring to FIG. 19, the following explanation describes still another embodiment of the present invention. Here, for convenience of explanation, those members that have the same functions and that are described in the aforementioned embodiments are indicated by the same reference numerals and the description thereof is omitted.

As shown in FIG. 19, a TCP of the present embodiment is identical to the TCP of the fourth embodiment, except that a tape substrate 41 of the ninth embodiment is provided instead of a tape substrate 11 of the fourth embodiment and a liquid crystal driver IC chip 20 is mounted on a surface where input leads 3-1 through 3-14 are disposed. This arrangement makes it possible to achieve the same effect as the ninth embodiment.

[EMBODIMENT 11]

Figure 20:
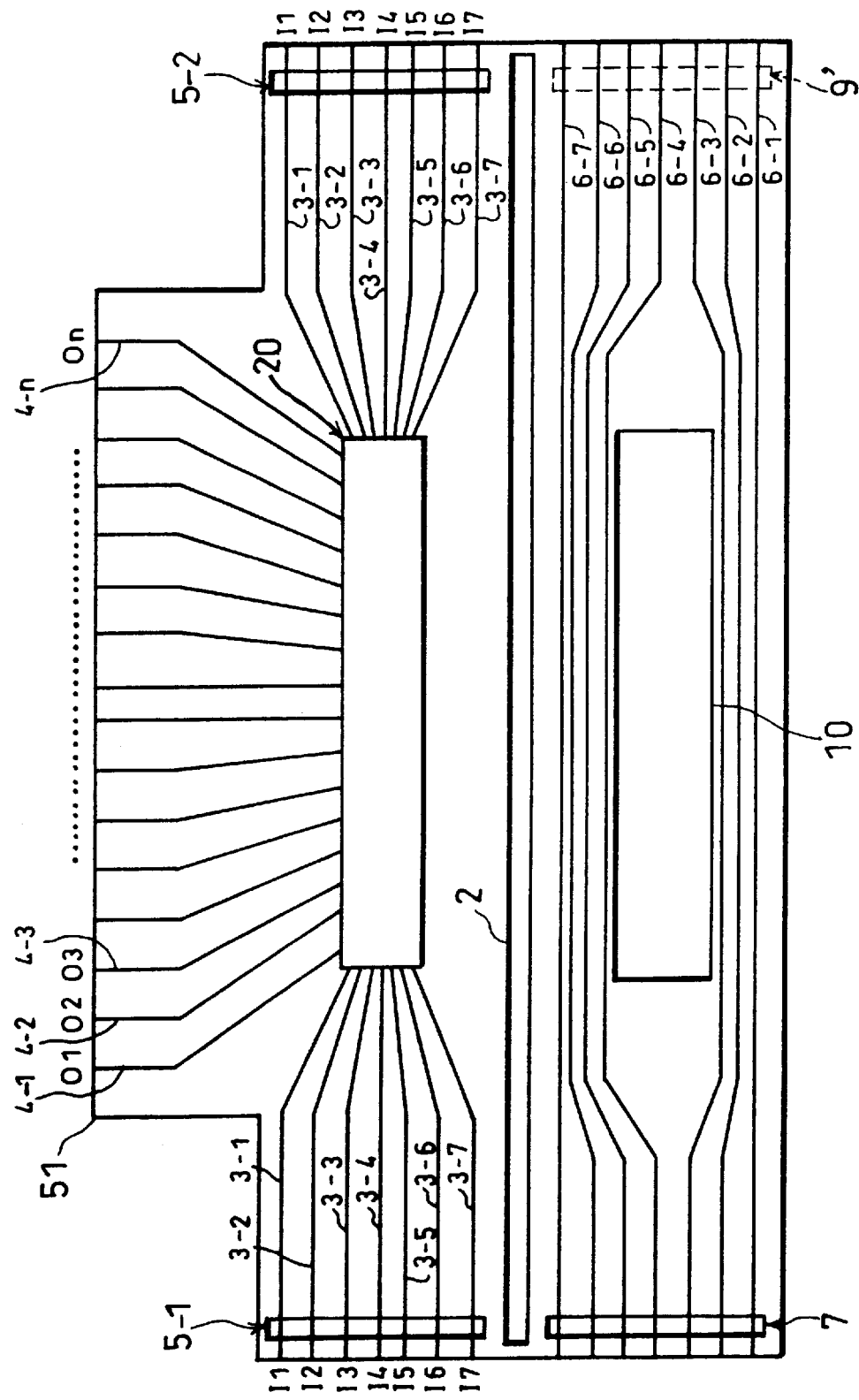
FIG. 20 is a plan view schematically showing a TCP of an eleventh embodiment of the present invention.

Referring to FIG. 20, the following explanation describes still another embodiment of the present invention. Here, for convenience of explanation, those members that have the same functions and that are described in the aforementioned embodiments are indicated by the same reference numerals and the description thereof is omitted.

As shown in FIG. 20, a TCP of the present embodiment is identical to the TCP of the fifth embodiment, except that: unlike a tape substrate 21 of the fifth embodiment, a tape substrate 51 is provided so as to include a chip hole 10 for inserting a liquid crystal driver IC chip 20, and the liquid crystal driver IC chip 20 is mounted on a surface where input leads 3-1 through 3-7 are provided.

Therefore, regardless of the thickness of the liquid crystal driver chip 20, it is possible to fold the tape substrate 51 into 180 degrees without a gap, while the surface, on which the liquid crystal driver IC chip 20 is mounted, is allowed to be inside the tape substrate 51. Thus, the tape substrate 41 can be folded into a compact substrate, and it is possible to prevent a damage occurring on the tape substrate 41, the wires on the tape substrate 41, and inner lead portion connected with the liquid crystal driver IC chip 20. Further, it is possible to realize a smaller thickness of the TCP upon mounting the liquid crystal driver IC chip 20.

[EMBODIMENT 12]

Figure 21:
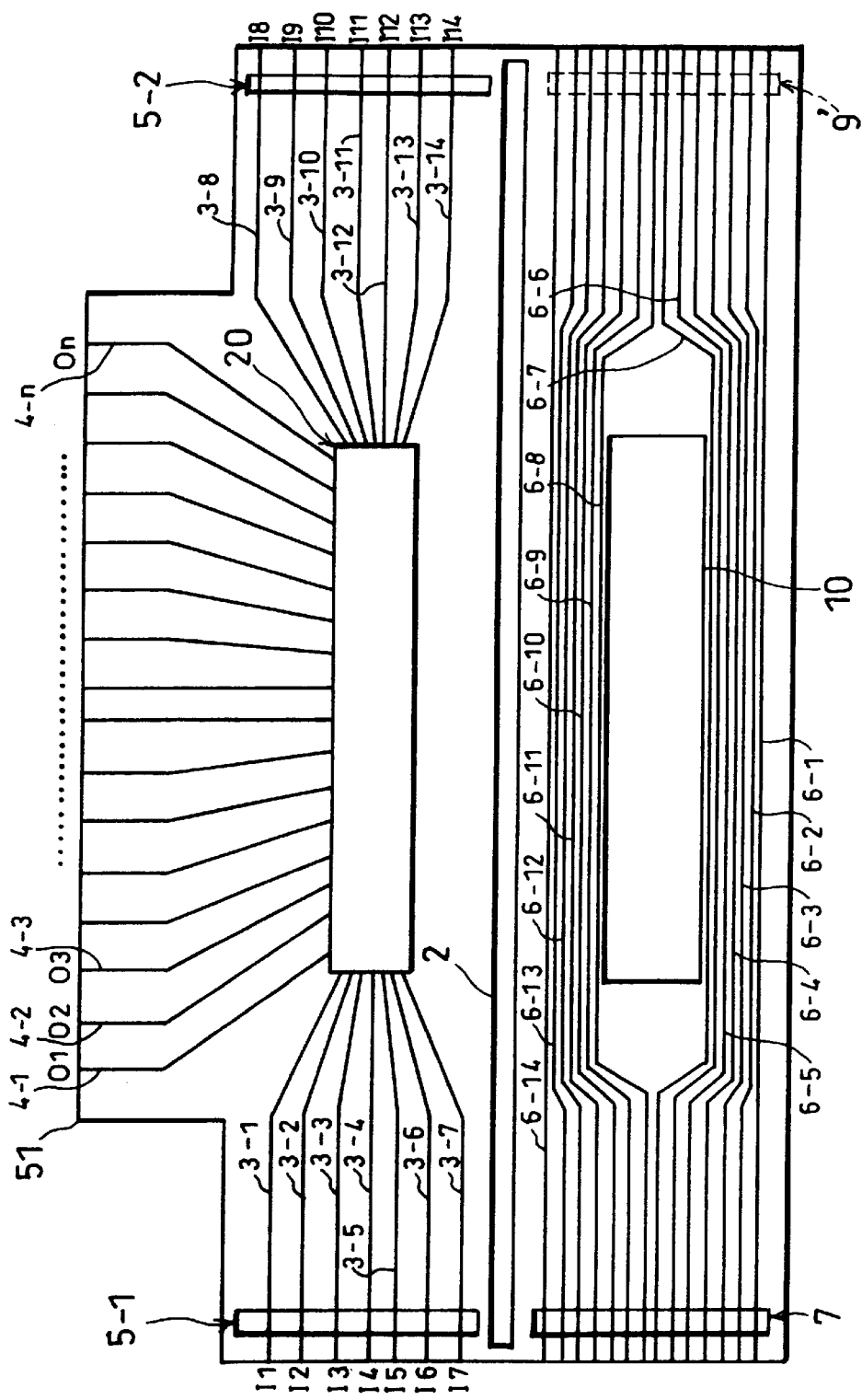
FIG. 21 is a plan view schematically showing a TCP of a twelfth embodiment of the present invention.
Figure 22:
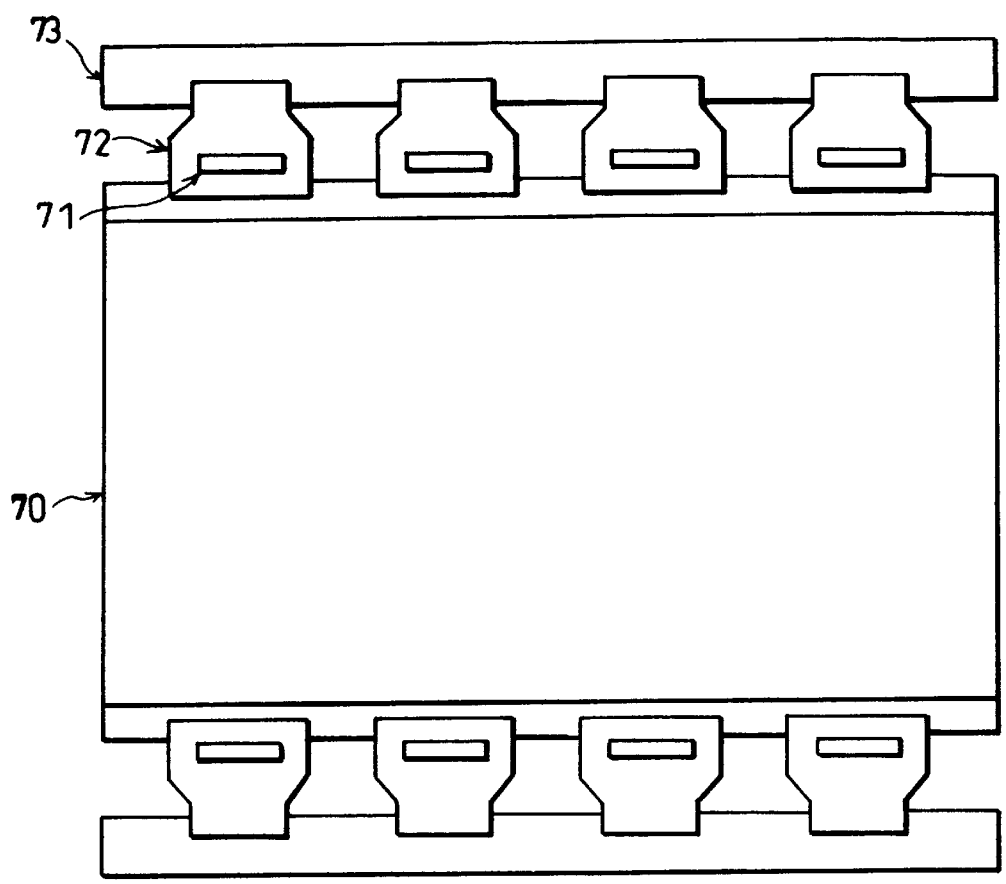
FIG. 22 is a plan view schematically showing a liquid crystal display device which includes a liquid crystal driver IC chip mounted on a conventional TCP.
Figure 23:
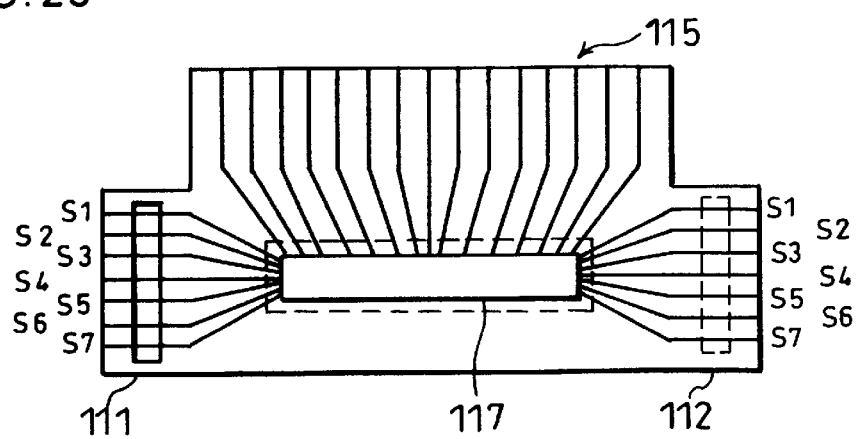
FIG. 23 is a plan view schematically showing another conventional TCP.

Referring to FIG. 21, the following explanation describes still another embodiment of the present invention. Here, for convenience of explanation, those members that have the same functions and that are described in the aforementioned embodiments are indicated by the same reference numerals and the description thereof is omitted.

As shown in FIG. 21, a TCP of the present embodiment is identical to the TCP of the sixth embodiment, except that a tape substrate 51 of the eleventh embodiment is provided instead of a tape substrate 21 of the sixth embodiment, and a liquid crystal driver IC chip 20 is mounted on a surface where input leads 3-1 through 3-14 are disposed. This arrangement makes it possible to achieve the same effect as the eleventh embodiment.

Each of the aforementioned embodiments is provided with a folding slit 2. However, the TCP of the present invention merely needs to have a construction in which the tape substrate can be folded into 180 degrees between the input leads and the signal transmitting wires. Therefore, the TCP of the present invention is also allowed to include more than one folding slits. Furthermore, the TCP of the present invention is also allowed to include a perforated portion or a thin portion instead of one folding slit 2. Here, the construction including the folding slit has the following advantages: the conventional arrangement hardly needs to be changed as compared with the construction including a perforated portion or a thin portion, and the tape can be processed in a relatively simple manner.

Moreover, in the aforementioned embodiments, the input leads 3 are respectively connected with the transmitting wires 6; however, it is also allowed to have a construction in which merely some of the input leads 3 are connected with the signal transmitting wires 6. Further, in the case when the liquid crystal driver IC chip 20 is provided with a dummy pad in order to connect the liquid crystal driver IC chip 20 to the TCP in a stable manner, the wires connected to the dummy pad can be connected with the signal transmitting wires 6.

Further, it has been proved that any one of the following chips can be adopted as the liquid crystal IC chip 20: an active-matrix driving liquid crystal driver IC chip such as a thin film transistor (TFT) liquid crystal driver chip, and a simple matrix driving (duty driving) liquid crystal driver IC chip. Furthermore, the aforementioned embodiments described a construction in which the liquid crystal driver IC chip 20 is mounted on the TCP so as to drive a liquid crystal panel; however, the IC of the present invention is not limited to the liquid crystal driver IC chip.

As described above, a first tape carrier package of the present invention, that supports an integrated circuit and transmits a signal between a section external to the TCP and the integrated circuit, including: on one of the surfaces of a tape substrate, a plurality of leads for transmitting a signal between the section external to the TCP and the integrated circuit, and signal transmitting wires for transmitting a signal among a plurality of the leads (between the adjacent tape carrier packages, or in a tape carrier package), is characterized in that the tape substrate can be folded into 180 degrees along a straight line serving as a fold between the leads and the signal transmitting wires so as to overlay the leads onto the signal transmitting wires in order to electrically connect the leads to the signal transmitting wires.

With the above-mentioned arrangement, the tape substrate is folded into 180 degrees along a straight line serving as a fold between the leads and the signal transmitting wires so as to overlay the leads onto the signal transmitting wires; thus, the leads can be electrically connected to the signal transmitting wires by soldering, etc. This arrangement makes it possible to transmit input signals and supply power among a plurality of leads by mainly using the signal transmitting wires disposed on the tape carrier package, the signal transmitting wires having lower wire resistance as compared with the wires of the integrated circuit. Therefore, it is possible to prevent a voltage drop, that has been caused by wire resistance (especially, a power supplying wire) of the integrated circuit when a number of TCPs are connected in a conventional construction, which uses merely the wires of the integrated circuit for transmitting input signals and supplying power. For example, this arrangement makes it possible to prevent a degradation in display quality of a liquid crystal display device. Furthermore, with this arrangement, the signal transmitting wires are disposed in a horizontal space of the tape substrate, so that this arrangement can have virtually the same external dimension as the arrangement which has no signal transmitting wire.

Additionally, it is possible to overlay the input leads of the tape substrate onto the signal transmitting wires of another tape substrate so as to connect the input leads to the signal transmitting wires. In this case, a shift tends to occur between the input leads and the signal transmitting wires due to an error upon overlaying the tape substrate onto the other. Meanwhile, in the above-mentioned arrangement, the input leads and the signal transmitting wires are disposed on the same tape substrate so as to regulate an error occurring upon overlaying the tape substrate (shift upon folding the tape substrate in half). Consequently, it is possible to improve accuracy upon overlaying the input leads onto the signal transmitting wires.

With the arrangement of the first tape carrier package, a second tape carrier package of the present invention is characterized in that the tape substrate is provided with a folding slit disposed along the fold.

With the above-mentioned arrangement, the folding slit is provided along the fold so as to precisely overlay the leads onto the signal transmitting wires. Further, upon folding the tape substrate, the tape substrate can be brought into intimate contact so as to electrically connect the leads to the signal transmitting wires by soldering, etc. in a simple and positive manner. Moreover, it is possible to reduce stress applied to the fold of the tape substrate so as to prevent a damage of the tape substrate.

With the arrangement of the first or the second tape carrier package, a third tape carrier package of the present invention is characterized in that the tape substrate is provided with an external connection slit for connecting the leads and the signal transmitting wires with the section external to the TCP, the external connection slit being disposed so as to partially expose the leads and the signal transmitting wires.

This arrangement makes it possible to solder the leads and the signal transmitting wires that are exposed through the external connection slit, thereby electrically connecting the leads and the signal transmitting wires in a simpler and more positive manner.

Further, a plurality of tape carrier packages are arranged so as to overlay the external connection slit of the tape carrier package onto the external connection slit of another, and then, the leads. and the signal transmitting wires, that are exposed through the external connection slit, are soldered to the leads and the signal transmitting wires of another tape carrier package; consequently, it is possible to electrically connect the leads and the signal transmitting wires among the tape carrier packages. Therefore, among the tape carrier packages, it is possible to directly supply power and transmit signals among the tape carrier packages. As a result, it is not necessary to connect a parallel connection substrate, which supplies power and transmits signals, to each of the tape carrier packages; thus, it is possible to realize a more compact and lightweight device including a liquid crystal display device and to reduce the cost.

With the arrangement of the third tape carrier package, a fourth tape carrier package of the present invention is characterized in that when the tape substrate is folded into 180 degrees along a straight line serving as a fold between the leads and the signal transmitting wires so as to overlay the leads onto the signal transmitting wires, at least parts of the leads and the signal transmitting wires, that are exposed by the external connection slit, are supported by a region of the tape substrate that opposes the external connection slit.

With this arrangement, when the tape substrate is folded into 180 degrees along a straight line serving as a fold between the leads and the signal transmitting wires so as to overlay the leads onto the signal transmitting wires, at least parts of the leads and the signal transmitting wires, that are exposed by the external connection slit, are supported by a region of the tape substrate that opposes the external connection slit. Therefore, as compared with a construction in which a region opposing the external connection slit serves as an external connection slit having no tape substrate, it is possible to regulate breaking of wire on the leads and the signal transmitting wires that are exposed by the external connection slit. Thus, breaking of wire can be prevented upon handling, so that it is possible to realize an easy-to-handle tape substrate and to improve reliability of the electrical connection.

With any one of the arrangements of the first through fourth tape carrier packages, a fifth tape carrier package of the present invention is characterized in that on the tape substrate, after the integrated circuit is mounted, when the tape substrate is folded into 180 degrees along a straight line serving as a fold between the leads and the signal transmitting wires so as to overlay the leads onto the signal transmitting wires, a window portion is provided for inserting the integrated circuit at a position overlaid with the integrated circuit.

Generally, the integrated circuit is provided on the surface where the leads are disposed, in the tape substrate. In this structure, when the tape substrate is folded so as to allow the surface having the leads to be inside of the tape substrate, the integrated circuit is sandwiched between the tape substrates; thus, it is not possible to bring the tape substrate into intimate contact due to the thickness of the integrated circuit. Therefore, with the integrated circuit, the thickness of the entire tape carrier package is increased and stress is applied to the tape substrate; consequently, a damage may appear on the tape substrate or the wires including the leads and the signal transmitting wires and on an inner lead portion for connecting the integrated circuit and the wires of the tape substrate.

However, with the above-mentioned arrangement, after the integrated circuit is mounted, when the tape substrate is folded into 180 degrees along a straight line serving as a fold between the leads and the signal transmitting wires so as to overlay the leads onto the signal transmitting wires, the window portion inserts the integrated circuit at a position which is overlaid with the integrated circuit.

With this arrangement, after the integrated circuit is mounted on the tape substrate surface where the leads are disposed, when the tape substrate is folded into 180 degrees along a straight line serving as a fold between the leads and the signal transmitting wires so as to overlay the leads onto the signal transmitting wires, the integrated circuit is inserted into the window portion; therefore, regardless of the thickness of the integrated circuit, the tape substrate can be brought into intimate contact. Thus, it is possible to further reduce the thickness of the tape carrier package upon mounting the integrated circuit, and it is possible to prevent a damage occurring on the tape substrate or the wires of the tape substrate that include the leads and the signal transmitting wires, and on an inner lead portion for connecting the wires and the integrated circuit of the tape substrate; consequently, reliability of the electrical connection can be improved.

Further, as compared with the case in which the integrated circuit is mounted on the back of the tape substrate surface where the leads are disposed, it is possible to further reduce the thickness of the tape carrier package upon mounting the integrated circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A tape carrier package, which supports an integrated circuit and transmits a signal between a section external to said tape carrier package and said integrated circuit, comprising:

a tape substrate having a first region and a second region on one of the surfaces thereof, a plurality of leads which are formed in said first region and transmit a signal between the section external to the tape carrier package and said integrated circuit, and signal transmitting wires which are formed in said second region and transmit a signal among a plurality of said leads, wherein said tape substrate can be folded into 180 degrees along a boundary between said first region and said second region such that said first region and said second region face each other, and a plurality of said leads are electrically connected to said signal transmitting wires in a folded state of said tape substrate.

2. The tape carrier package as defined in claim 1, wherein: said plurality of leads include n pairs of leads that are symmetrically formed via said integrated circuit, said signal transmitting wires are formed in a number of n pieces, and in the folded state of said tape substrate along the boundary, said pairs of leads partially overlap corresponding signal transmitting wires.

3. The tape carrier package as defined in claim 1, wherein: said plurality of leads include a first lead group and a second lead group, that are unsymmetrically formed via said integrated circuit; a positional shift appears between the first lead group and the second lead group at a connecting position with said signal transmitting wires; and in a folded state of said tape substrate, said signal transmitting wires are disposed so that each of the leads overlaps a corresponding signal transmitting wire.

4. The tape carrier package as defined in claim 3, wherein the positional shift between said first lead group and said second lead group is half intervals of each of said lead groups.

5. The tape carrier package as defined in claim 1, wherein said plurality of leads include input leads for inputting an input signal from the section external to the tape carrier package to said integrated circuit.

6. The tape carrier package as defined in claim 1, wherein said tape substrate has a folding slit along said boundary.

7. The tape carrier package as defined in claim 1, wherein said tape substrate has an external connection slit, which connects said leads and said signal transmitting wires with the section external to the tape carrier package, are disposed so as to partially expose said leads and said signal transmitting wires.

8. The tape carrier package as defined in claim 7, wherein when said tape substrate is folded into 180 degrees along a straight line serving as a fold between said leads and said signal transmitting wires so as to overlay said leads onto said signal transmitting wires, at least parts of said leads and said signal transmitting wires, that are exposed by said external connection slit, are supported by a region of the tape substrate that opposes said external connection slit.

9. The tape carrier package as defined in claim 1, wherein said tape substrate has an opening for inserting said integrated circuit at a position where said tape substrate is overlaid with said integrated circuit in a state in which said tape substrate is folded into 180 degrees along a straight line serving as a fold between said leads and said signal transmitting wires after said integrated circuit is mounted so as to overlay said leads onto said signal transmitting wires.

10. The tape carrier package as defined in claim 1, wherein first and second external connection slits, which connect the leads and the signal transmitting wires with the section external to the tape carrier package, are formed in said first and second regions so as to be overlaid with each other in a folded state of said tape substrate.

11. The tape carrier package as defined in claim 10, wherein a third external connection slit for connecting the leads and the signal transmitting wires with the section external to the tape carrier package is formed in said first region, said third external connection slit being supported by a portion of said second region, that is overlaid with said third external connection slit in the folded state of said tape substrate.

12. The tape carrier package as defined in claim 10, wherein a third external connection slit for connecting the leads and the signal transmitting wires with the section external to the tape carrier package is formed in said second region, said third external connection slit being supported by a portion of said second region, that is overlaid with said third external connection slit in a folded state of said tape substrate.

13. The tape carrier package as defined in claim 1, wherein an opening is formed in said second region for inserting the integrated circuit mounted on said first region.

14. The tape carrier package as defined in claim 1, wherein said tape substrate is provided with an insulating material for electrically insulating said plurality of leads and said signal transmitting wires in outside region where said plurality of leads are electrically connected with said signal transmitting wires.

15. The tape carrier package as defined in claim 14, wherein said insulating material is a solder resist.

* * * * *